(12) United States Patent
Chau

(10) Patent No.: US 9,738,513 B2
(45) Date of Patent: Aug. 22, 2017

(54) MEMS PRESSURE SENSOR AND METHOD FOR FORMING THE SAME

(71) Applicant: MEMSEN ELECTRONICS INC, Nankai District, Tianjin (CN)

(72) Inventor: Manhing Chau, Tianjin (CN)

(73) Assignee: MEMSEN ELECTRONICS INC, Nankai District, Tianjin (CN)

( * ) Notice: Subject to any disclaimer, the term of this patent is extended or adjusted under 35 U.S.C. 154(b) by 0 days.

(21) Appl. No.: 15/013,408

(22) Filed: Feb. 2, 2016

(65) Prior Publication Data

US 2016/0236932 A1  Aug. 18, 2016

(30) Foreign Application Priority Data

Feb. 16, 2015 (CN) .......................... 2015 1 0084563

(51) Int. Cl.
*B81C 1/00* (2006.01)
*B81B 7/00* (2006.01)
*G01L 9/00* (2006.01)

(52) U.S. Cl.
CPC .......... *B81C 1/00246* (2013.01); *B81B 7/008* (2013.01); *G01L 9/0073* (2013.01); *B81B 2201/0264* (2013.01); *B81B 2207/015* (2013.01); *B81B 2207/07* (2013.01); *B81B 2207/99* (2013.01)

(58) Field of Classification Search
CPC ............................................... B81C 1/00246
See application file for complete search history.

(56) References Cited

U.S. PATENT DOCUMENTS

| 2004/0163476 | A1 | 8/2004 | Partrifge et al. |
| 2012/0042731 | A1* | 2/2012 | Lin ....................... G01L 9/0073 73/718 |
| 2012/0211805 | A1 | 8/2012 | Winkler et al. |

(Continued)

FOREIGN PATENT DOCUMENTS

| CN | 102183335 A | 9/2011 |
| CN | 102226999 A | 10/2011 |

(Continued)

OTHER PUBLICATIONS

Chinese 1st Office Action corresponding to Application No. 201510084563.8; Issued: Jul. 25, 2016, with English translation.

*Primary Examiner* — Dung Le
(74) *Attorney, Agent, or Firm* — Cantor Colburn LLP

(57) ABSTRACT

Provided are a MEMS pressure sensor and a method for forming the MEMS pressure sensor. The method includes: preparing a first substrate, where the first substrate includes a first surface and a second surface opposite to the first surface; preparing a second substrate, where the second substrate includes a third surface and a fourth surface opposite to the third surface, the second substrate includes a pressure sensing region; bonding the first surface of the first substrate and the third surface of the second substrate with each other; forming a cavity between the first substrate and the pressure sensing region of the second substrate; removing the second base to form a fifth surface opposite to the third surface of the second substrate; and forming a first conductive plug passing through the second substrate from the side of the fifth surface of the second substrate to the at least one conductive layer.

48 Claims, 10 Drawing Sheets

(56) References Cited

U.S. PATENT DOCUMENTS

2014/0001579 A1    1/2014   Liu
2014/0048910 A1    2/2014   Liu
2014/0252422 A1    9/2014   Winkler et al.

FOREIGN PATENT DOCUMENTS

| CN | 102401706 A | 4/2012 |
| CN | 102674237 A | 9/2012 |
| JP | 2004260187 A | 9/2004 |

\* cited by examiner

MEMS PRESSURE SENSOR AND METHOD FOR FORMING THE SAME

CROSS REFERENCE TO RELATED APPLICATIONS

This application claims the priority to Chinese Patent Application No. 201510084563.8, titled "MEMS PRESSURE SENSOR AND METHOD FOR FORMING THE SAME", filed with the Chinese Patent Office on Feb. 16, 2015, which is hereby incorporated by reference in its entirety.

FIELD

The present disclosure relates to the technical field of semiconductor fabrication, and in particular to a Micro-Electro Mechanical System (abbreviated to MEMS) pressure sensor and a method for forming the MEMS pressure sensor.

BACKGROUND

A MEMS is a device which acquires and processes information and performs operations. A sensor in the MEMS can receive external information such as pressure, location, speed, acceleration, magnetic field, temperature or humidity, and convert the obtained external information into electrical signals to be processed in the system. An example of a MEMS device may include a temperature sensor, a pressure sensor, a humidity sensor and the like.

The cost performance of a MEMS pressure sensor can be greatly improved by reduced size, increased precision and utilization of a process that is compatible with a fabrication process of an integrated circuit chip. Currently, MEMS pressure sensors include a piezoresistive type pressure sensor and a capacitive type pressure sensor. In piezoresistive pressure sensor, a Wheatstone resistance bridge composed of a high-precision silicon resistor strain gage serves as a force-electric conversion measurement circuit according to a principle that the silicon resistor can be changed under a stress (pressure). Therefore, the piezoresistive pressure sensor has a high measuring accuracy and a low power consumption.

In a conventional method for fabricating a MEMS piezoresistive pressure sensor, firstly, multiple resistors or Wheatstone resistance bridges are formed in a silicon substrate by an ion implantation or diffusion process; then a region of the silicon substrate in which the resistors are arranged are etched with wet or dry process to form a sensing thin film; and finally, a pressure reference cavity is formed at the back of the sensing thin film by a sealing process, and a pressure sensor chip is formed after being packaged. The sensing thin film generates a deformation and a stress under an external pressure, and a resistance value of the resistor or resistance bridge is changed. Under a voltage bias, the above-described change of the resistance value is converted into an electrical signal, and the electrical signal being amplified by a signal processing circuit serves as an output signal.

In addition, the electrical signal is transmitted between the pressure sensor chip and the signal processing circuit, so that the electrical signal output by the pressure sensor chip is processed. The pressure sensor chip and the signal processing circuit chip are packaged in a system to form a MEMS piezoresistive pressure sensor.

In the existing methods for fabricating a MEMS pressure sensor, processes for fabricating the pressure sensor chip and the signal processing circuit are different, and it is difficult to achieve a monolithic integration. Moreover, in a case that an integrated circuit and a pressure sensor are fabricated on a single substrate, the existence of pressure sensor creates difficulty in making, changing and improving the integrated circuit, and the integrated circuit on the same substrate makes it difficult to fabricate a small pressure sensor. Therefore, a process for fabricating an integrated circuit and a pressure sensor on a single chip is complicated and a device formed by the current process has a large size, thereby increasing its fabrication cost.

In a case that the pressure sensor and the circuit are integrated on a single substrate, if the pressure sensor is fabricated before the circuit is fabricated, a process for fabricating the pressure sensor often affects the substrate and causes a difficulty in fabricating the integrated circuit, thereby reducing production yield; alternatively, if the integrated circuit is fabricated before the pressure sensor is fabricated, the integrated circuit may limit greatly the choice of material of the pressure sensor and the temperature in a process for fabricating the pressure sensor, thereby decreasing the performance of the pressure sensor.

Hence, there is an urgent need for a method and a structure for effectively integrating a pressure sensor and an integrated circuit.

SUMMARY

The present disclosure provides a MEMS pressure sensor and a method for fabricating the MEMS pressure sensor. In the method for fabricating the MEMS pressure sensor, the MEMS pressure sensor structure and the circuit fabrication processes are independent from one another, selection of material is more flexible, production yield is high and a subsequent integrating process is simple, thereby improving the performance and reliability of the formed integrated pressure sensor, and reducing the size and process cost.

In order to address the existing issue, the present disclosure provides a method for forming a MEMS pressure sensor. The method includes: preparing a first substrate, wherein the first substrate includes a first surface and a second surface opposite to the first surface, and the first substrate includes at least one conductive layer arranged on the side of the first surface of the first substrate; preparing a second substrate, wherein the second substrate includes a third surface and a fourth surface opposite to the third surface, the second substrate includes a second base and a piezoresistive element arranged on or above the second base, the second substrate includes a pressure sensing region in which the piezoresistive element is arranged, and the piezoresistive element is arranged on the side of the third surface of the second substrate; bonding the first surface of the first substrate and the third surface of the second substrate with each other; forming a cavity between the first substrate and the pressure sensing region of the second substrate; removing the second base to form a fifth surface opposite to the third surface of the second substrate; and forming a first conductive plug passing through the second substrate from the side of the fifth surface of the second substrate to the at least one conductive layer, where the first conductive plug is used to electrically connect the conductive layer to the piezoresistive element.

Optionally, the first substrate may further include a circuit.

Optionally, the preparing the second substrate may include: preparing a semiconductor-on-insulator substrate, where the semiconductor-on-insulator substrate includes a base, an insulating layer on a surface of the base and a semiconductor layer on a surface of the insulating layer; and forming a piezoresistive element in the semiconductor layer, with the base being the second base.

Optionally, the second substrate may further include a second coupling layer arranged on the side of the third surface; or, the first substrate may include a first coupling layer arranged on the side of the first surface; or, the second substrate may further include a second coupling layer arranged on the side of the third surface and the first substrate may include a first coupling layer arranged on the side of the first surface.

Optionally, at least one of the first coupling layer and the second coupling layer may be comprised of an insulating material.

Optionally, the first surface of the first substrate and the third surface of the second substrate may be bonded with each other by an adhesive bonding process, and the first coupling layer or the second coupling layer may be an adhesive bonding layer which is comprised of an insulating material, a semiconductor material, a metal material or an organic material.

Optionally, the first surface of the first substrate and the third surface of the second substrate may be bonded with each other by a direct-bonding process.

Optionally, the forming the cavity may include: forming a first opening before the first surface of the first substrate and the third surface of the second substrate are bonded with each other, where the first opening is arranged on the side of the third surface of the second substrate or the side of the first surface of the first substrate, or, the first opening is arranged on both the side of the first surface of the first substrate and the side of the third surface of the second substrate, with a location of the first opening corresponding to a location of the pressure sensing region.

Optionally, the first substrate may further include a self-test electrode, with a location of the self-test electrode corresponding to a location of the pressure sensing region after the first surface of the first substrate and the third surface of the second substrate are bonded with each other.

Optionally, the second substrate may further include a reference unit region, a cavity may be further formed between the first substrate and the reference unit region of the second substrate when the first surface of the first substrate and the third surface of the second substrate are bonded with each other, and a deformation on a portion of the second substrate corresponding to the reference unit region is less than a deformation on a portion of the second substrate corresponding to the pressure sensing region under a same external pressure.

Optionally, the method may further include: forming a second opening passing through the first substrate, where a location of the second opening corresponds to a location of the pressure sensing region of the second substrate after the first surface of the first substrate and the third surface of the second substrate are bonded with each other.

Optionally, the method may further include: forming a fourth conductive plug passing through the first substrate from the side of the second surface of the first substrate to the at least one conductive layer.

Accordingly, the present disclosure further provides a method for forming a MEMS pressure sensor. The method includes: preparing a first substrate, where the first substrate includes a first surface and a second surface opposite to the first surface, and the first substrate includes at least one conductive layer arranged on the side of the first surface of the first substrate; preparing a second substrate, where the second substrate includes a third surface and a fourth surface opposite to the third surface, the second substrate includes a second base and a piezoresistive element arranged on or above or in the second base, the second substrate includes a pressure sensing region in which the piezoresistive element is arranged, and the piezoresistive element is arranged on the side of the third surface of the second substrate; bonding the first surface of the first substrate and the third surface of the second substrate with each other; forming a cavity between the first substrate and the pressure sensing region of the second substrate; thinning the second substrate from the fourth surface by partially removing the second base, to form a fifth surface opposite to the third surface of the second substrate; and forming a first conductive plug passing through the second substrate from the side of the fifth surface of the second substrate to the at least one conductive layer, where the first conductive plug is used to electrically connect the conductive layer to the piezoresistive element.

Optionally, the first substrate may further include a circuit.

Optionally, a third opening may be formed in the second substrate after the second substrate is thinned from the fourth surface, with a location of the third opening corresponding to a location of the pressure sensing region.

Optionally, the preparing the second substrate may include: preparing a semiconductor-on-insulator substrate, where the semiconductor-on-insulator substrate includes a base, an insulating layer on a surface of the base and a semiconductor layer on a surface of the insulating layer; and forming a piezoresistive element in the semiconductor layer, with the base being the second base.

Optionally, the second substrate may further include a second coupling layer arranged on the side of the third surface; or, the first substrate may include a first coupling layer arranged on the side of the first surface; or, the second substrate may further include a second coupling layer arranged on the side of the third surface and the first substrate may include a first coupling layer arranged on the side of the first surface.

Optionally, at least one of the first coupling layer and the second coupling layer may be comprised of an insulating material.

Optionally, the first surface of the first substrate and the third surface of the second substrate may be bonded with each other by an adhesive bonding process, and the first coupling layer or the second coupling layer may be an adhesive bonding layer which is comprised of an insulating material, a semiconductor material, a metal material or an organic material.

Optionally, the first surface of the first substrate and the third surface of the second substrate may be bonded with each other by a direct-bonding process.

Optionally, the forming the cavity may include: forming a first opening before the first surface of the first substrate and the third surface of the second substrate are bonded with each other, where the first opening is arranged on the side of the third surface of the second substrate or the side of the first surface of the first substrate, or, the first opening is arranged on both the side of the first surface of the first substrate and the side of the third surface of the second substrate, with a location of the first opening corresponding to a location of the pressure sensing region.

Optionally, the first substrate may further include a self-test electrode, with a location of the self-test electrode corresponding to a location of the pressure sensing region after the first surface of the first substrate and the third surface of the second substrate are bonded with each other.

Optionally, the second substrate may further include a reference unit region, a cavity may be further formed between the first substrate and the reference unit region of the second substrate when the first surface of the first substrate and the third surface of the second substrate are bonded with each other, and a deformation on a portion of the second substrate corresponding to the reference unit region is less than a deformation on a portion of the second substrate corresponding to the pressure sensing region under a same external pressure.

Optionally, the method may further include: forming a second opening passing through the first substrate, where a location of the second opening corresponds to a location of the pressure sensing region of the second substrate after the first surface of the first substrate and the third surface of the second substrate are bonded with each other.

Optionally, the method may further include: forming at least one fifth through hole passing through the second base, on the side of the fifth surface of the second substrate, with a location of the fifth through hole corresponding to a location of the pressure sensing region.

Optionally, the method may further include: forming a fourth conductive plug passing through the first substrate from the side of the second surface of the first substrate to the at least one conductive layer.

The present disclosure may further provide a MEMS pressure sensor. The MEMS pressure sensor includes: a first substrate, where the first substrate includes a first surface and a second surface opposite to the first surface, and the first substrate includes at least one conductive layer arranged on the side of the first surface of the first substrate; a second substrate, where the second substrate includes a third surface and a fifth surface opposite to the third surface, the second substrate includes a piezoresistive element, and the second substrate includes a pressure sensing region in which the piezoresistive element is arranged, the first surface of the first substrate and the third surface of the second substrate are bonded with each other; a cavity formed between the first substrate and the pressure sensing region of the second substrate; and a first conductive plug passing through the second substrate from the side of the fifth surface of the second substrate to the at least one conductive layer, where the first conductive plug is used to electrically connect the conductive layer to the piezoresistive element.

Optionally, the first substrate may further include a circuit.

Optionally, the second substrate may further include a second coupling layer arranged on the side of the third surface; or, the first substrate may include a first coupling layer arranged on the side of the first surface; or, the second substrate may further include a second coupling layer arranged on the side of the third surface and the first substrate may include a first coupling layer arranged on the side of the first surface.

Optionally, at least one of the first coupling layer and the second coupling layer may be comprised of an insulating material.

Optionally, the first coupling layer or the second coupling layer may be an adhesive bonding layer which is comprised of an insulating material, a semiconductor material, a metal material or an organic material.

Optionally, the first coupling layer may be a bonding layer; or, the second coupling layer may be a bonding layer; or, the first coupling layer and the second coupling layer may be bonding layers.

Optionally, the first substrate may further include a self-test electrode, with a location of the self-test electrode corresponding to a location of the pressure sensing region of the second substrate.

Optionally, the second substrate may further include a reference unit region, a cavity may be further formed between the first substrate and the reference unit region of the second substrate, and a deformation on a portion of the second substrate corresponding to the reference unit region is less than a deformation on a portion of the second substrate corresponding to the pressure sensing region.

Optionally, the MEMS pressure sensor may further include a second opening passing through the first substrate, with a location of the second opening corresponding to a location of the pressure sensing region of the second substrate.

Optionally, the MEMS pressure sensor may further include a fourth conductive plug passing through the first substrate from the side of the second surface of the first substrate to the at least one conductive layer.

The present disclosure further provides a MEMS pressure sensor. The MEMS pressure sensor includes: a first substrate, where the first substrate includes a first surface and a second surface opposite to the first surface, and the first substrate includes at least one conductive layer arranged on the side of the first surface of the first substrate; a second substrate, where the second substrate includes a third surface and a fifth surface opposite to the third surface, the second substrate includes a second base and a piezoresistive element arranged on or above or in the second base, the second substrate includes a pressure sensing region in which the piezoresistive element is arranged, the first surface of the first substrate and the third surface of the second substrate are bonded with each other; a cavity formed between the first substrate and the pressure sensing region of the second substrate; and a first conductive plug passing through the second substrate from the side of the fifth surface of the second substrate to the at least one conductive layer, where the first conductive plug is used to electrically connect the conductive layer to the piezoresistive element.

Optionally, the first substrate may further include a circuit.

Optionally, a third opening may be formed in the second substrate, with a location of the third opening corresponding to a location of the pressure sensing region.

Optionally, the second substrate may further include a second coupling layer arranged on the side of the third surface; or, the first substrate may include a first coupling layer arranged on the side of the first surface; or, the second substrate may further include a second coupling layer arranged on the side of the third surface and the first substrate may include a first coupling layer arranged on the side of the first surface.

Optionally, at least one of the first coupling layer and the second coupling layer may be comprised of an insulating material.

Optionally, the first coupling layer or the second coupling layer may be an adhesive bonding layer which is comprised of an insulating material, a semiconductor material, a metal material or an organic material.

Optionally, the first coupling layer may be a bonding layer; or, the second coupling layer may be a bonding layer; or, the first coupling layer and the second coupling layer may be bonding layers.

Optionally, the first substrate further may include a self-test electrode, with a location of the self-test electrode corresponding to a location of the pressure sensing region of the second substrate.

Optionally, the second substrate may further include a reference unit region, a cavity may be further formed between the first substrate and the reference unit region of the second substrate, and a deformation on a portion of the second substrate corresponding to the reference unit region is less than a deformation on a portion of the second substrate corresponding to the pressure sensing region.

Optionally, a second opening passing through the first substrate may be formed, with a location of the second opening corresponding to a location of the pressure sensing region of the second substrate.

Optionally, the MEMS pressure sensor may further include: at least one fifth through hole arranged on the side of the fifth surface of the second substrate and passing through the second base, with a location of the fifth through hole corresponding to a location of the pressure sensing region.

Optionally, the MEMS pressure sensor may further include: a fourth conductive plug passing through the first substrate from the side of the second surface of the first substrate to the at least one conductive layer.

Compared with the conventional technologies, technical schemes of the present disclosure have the following advantages.

In a fabrication method according to the present disclosure, a first substrate including a conductive layer and a second substrate including a piezoresistive element are prepared. The conductive layer is arranged on the side of a first surface of the first substrate, and the piezoresistive element is arranged on the side of a third surface of the second substrate. A stacked structure of the first substrate and the second substrate can be formed by bonding the first surface of the first substrate and the third surface of the second substrate with each other. The conductive layer may be used to transmit an electrical signal output by the piezoresistive element. A first conductive plug passing through the second substrate from a fifth surface opposite to a third surface of the second substrate to the conductive layer is formed after a second base is removed and the fifth surface is formed, to electrically connect the conductive layer and the piezoresistive element. Since the first conductive plug is exposed in the fifth surface of the second substrate, it is easy to form subsequently a first conductive structure, which is electrically connected to the piezoresistive element, at the top of the first conductive plug, and thus the piezoresistive element is electrically connected to the conductive layer.

The conductive layer is formed in the first substrate, the piezoresistive element is formed in the second substrate, and the first substrate is overlapped with the second substrate by bonding the first surface of the first substrate and the third surface of the second substrate with each other. Therefore, it is avoided to form a conductive layer, a piezoresistive element overlapped with the conductive layer and a cavity between the piezoresistive element and the base in a layer by layer manner on a single base, thereby reducing the difficulty of processes and, in particular, reducing the difficulty of a process for forming the cavity. Furthermore, it can be avoided that a temperature in a process for forming the first substrate limits or affects a fabrication process of the second substrate. In this case, the selection of material and processes for the second substrate and the piezoresistive element in the second substrate are more flexible, and the performance of the formed piezoresistive element is improved.

Since the first surface of the first substrate is in contact with the third surface of the second substrate, a contact area between the first surface and the third surface is large and a bonding strength between the first substrate and the second substrate is high. In this case, it is not easy to bend, break or deform the first substrate and the second substrate stack, thereby providing a more stable and reliable structure of the formed pressure sensor and improving the durability of the formed pressure sensor.

With the above method, the distance between the fourth surface of the second substrate and the second surface of the first substrate is short, thereby reducing the size and the fabrication cost of the formed pressure sensor.

Besides, since the conductive layer is electrically connected to the piezoresistive element by forming a first conductive plug passing through the second substrate from the fifth surface of the second substrate to the conductive layer, no additional conductive layer is necessary between the first surface of the first substrate and the third surface of the second substrate for the purpose of providing electrical connection, avoiding any negative impact that could be generated by the additional conductive layer. Since the selections of material of the first surface of the first substrate and material of the third surface of the second substrate are more flexible, a large thermal expansion coefficient mismatch between the material of the first surface and the material of the third surface can be avoided, and the performance of the formed pressure sensor can be made more stable. Moreover, since the processes for forming the first substrate and the second substrate are more flexible, the fabrication process of the pressure sensor is more compatible with various fabrication processes of integrated conductive layers, thereby reducing the fabrication cost.

Further, the first substrate includes a circuit. An electrical signal output from the piezoresistive element in the second substrate can be readily processed by the circuit since the first substrate is bonded and electrically coupled with the second substrate.

Further, the second substrate is formed by preparing a semiconductor-on-insulator substrate. Specifically, a piezoresistive element can be formed by performing an ion doping on a semiconductor layer in the semiconductor-on-insulator substrate. The piezoresistive element is deformed under a pressure, which leads to stress and a resistance change, thereby outputting an electrical signal related to the stress on the piezoresistive element. Since a semiconductor layer in the semiconductor-on-insulator substrate is comprised of single crystal semiconductor material, the piezoresistive element formed by doping ions into the single crystal semiconductor material has a good piezoresistive property, thereby improving the sensitivity and the stability of the formed piezoresistive element.

Further, a first opening is formed from the third surface of the second substrate or the first surface of the first substrate, or, first openings are formed respectively from the first surface and the third surface. A cavity between the piezoresistive element and the conductive layer is formed with the first opening and the first surface of the first substrate when the first surface of the first substrate and the third surface of the second substrate are bonded with each other. The first surface contacts with the third surface in a large area other than a location of the first opening. Therefore, a total thickness of the bonded first and second substrates is small, a mechanical strength of the first and second substrate stack is high and the performance of the formed pressure sensor is improved.

Further, the first substrate further may include a self-test electrode, with a location of the self-test electrode corresponding to a location of the piezoresistive element after the first surface of the first substrate and the third surface of the second substrate are bonded with each other. The self-test electrode can generate an electrostatic pulling force and therefore a deformation on the piezoresistive element. A resistance change in the piezoresistive element as a result of this deformation can be used to detect whether the piezoresistive element works normally.

Further, the second substrate includes a sensing unit region and a reference unit region, and cavities are respectively formed in the sensing unit region and the reference unit region. For example, a cover layer may be formed on a portion of the fifth surface of the second substrate corresponding to the reference unit region. In this case, a change in a resistance of a piezoresistive element in the reference unit region due to an external pressure can be avoided or reduced, however the resistance of the piezoresistive element in the reference unit region may be changed due to a factor other than a pressure. An electrical signal generated only due to the external pressure can be obtained by subtracting the electrical signal output by the piezoresistive element in the reference unit region from an electrical signal output by the piezoresistive element in the sensing region. Therefore, the accuracy of the formed pressure sensor is improved.

Further, a second opening passing through the first substrate is formed, with a location of the second opening corresponding to a location of the pressure sensing region after the first surface of the first substrate and the third surface of the second substrate are bonded with each other. Since the second opening is exposed to an external environment, two sides of a piezoresistive element can acquire pressures from the external environment and the piezoresistive element can acquire a signal representing a difference between the pressures on the two sides of the piezoresistive element. In this case, the formed pressure sensor can serves as a differential pressure sensor.

In another forming method according to the present disclosure, a first substrate including a conductive layer and a second substrate including a piezoresistive element are prepared. A stacked layer structure of the first and second substrates can be formed by directly bonding a first surface of the first substrate and a third surface of the second substrate with each other. The conductive layer can transmit an electrical signal output from the piezoresistive element. In order to electrically connect the conductive layer to the piezoresistive element, a first conductive plug passing through the second substrate from a fifth surface of the second substrate to the conductive layer is formed after a second base is thinned partially and the fifth surface is formed. Since the first conductive plug is exposed in the fifth surface of the second substrate, it is easy to form subsequently a first conductive structure, which is electrically connected to the piezoresistive element, at the top of the first conductive plug, and thus the piezoresistive element is electrically connected to the conductive layer. Since the first surface is in contact with the third surface in a large area, the mechanical strength of the first and second substrate stack is high and the formed pressure sensor has a stable structure and an improved durability. In addition, the size of the formed pressure sensor is small since a distance between the fifth surface of the second substrate and a second surface of the first substrate is short. Since the selection of material of the first surface and material of a third surface is more flexible, an excessive thermal expansion coefficient mismatch between the material of the first surface and the material of the third surface are avoided, and the performance of the formed pressure sensor can be more stable.

Further, the second substrate includes a third opening, with a location of the third opening corresponds to a location of the pressure sensing region. Since regions other than the pressure sensing region are covered by the second base, a distance from the piezoresistive element to the external environment may be increased, thereby protecting the piezoresistive element and avoiding a wear or other damages on the piezoresistive element and a protective layer on a surface of the piezoresistive element.

A structure according to the present disclosure includes a first substrate including a conductive layer, and a second substrate including a piezoresistive element. The conductive layer is arranged on the side of a first surface of the first substrate. The first surface of the first substrate and a third surface of the second substrate are bonded with each other. Therefore, the first substrate and the second substrate are overlapped with each other, and the conductive layer is used to transmit an electrical signal output from the piezoresistive element. A first conductive plug passing through the second substrate from a fifth surface of the second substrate to the conductive layer is formed, and the piezoresistive element can be electrically connected to the conductive layer via the first conductive plug and a first conductive structure. Since the first surface contacts the third surface in a large area, a mechanical strength of the first and second substrates stack is high and the formed pressure sensor has a stable structure and an improved durability. In addition, the size of the formed pressure sensor is small since a distance between a fifth surface of the second substrate and a second surface of the first substrate is short. Since the selection of material of the first surface and material of a third surface are is more flexible, an excessive thermal expansion coefficient mismatch between the material of the first surface and the material of the third surface are avoided, and the performance of the formed pressure sensor can be more stable.

Another structure according to the present disclosure includes a first substrate including a conductive layer, and a second substrate including a second base and a piezoresistive element arranged on or above the second base. The conductive layer is arranged on the side of a first surface of the first substrate, and the piezoresistive element is arranged on the side of a third surface of the second substrate. Since the first surface of the first substrate and the third surface of the second substrate are bonded with each other, the first substrate is overlapped with the second substrate, and the conductive layer is used to transmit an electrical signal output from the piezoresistive element. The piezoresistive element can be protected by the second base since the second base is arranged on the side of a fifth surface of the second substrate. In addition, a first conductive plug passing through the second substrate from the fifth surface of the second substrate to the conductive layer is formed, and the piezoresistive element can be electrically connected to the conductive layer via the first conductive plug and a first conductive structure. Since the first surface contacts with the third surface in a large area, a mechanical strength of the first and second substrates is high and the formed pressure sensor has a stable structure and an improved durability. Furthermore, there is no extra space between the first surface of the first substrate and the third surface of the second substrate, a distance between the fifth surface of the second substrate and a second surface of the first substrate is short, and hence the size of the formed pressure sensor is small. Since the selection of material of the first surface and material of a third surface is more flexible, an excessive thermal expansion coefficient mismatch between the material of the first surface and of the material of the third surface are avoided, and the performance of the formed pressure sensor can be more stable.

DETAILED DESCRIPTION OF EMBODIMENTS

Figure 1:
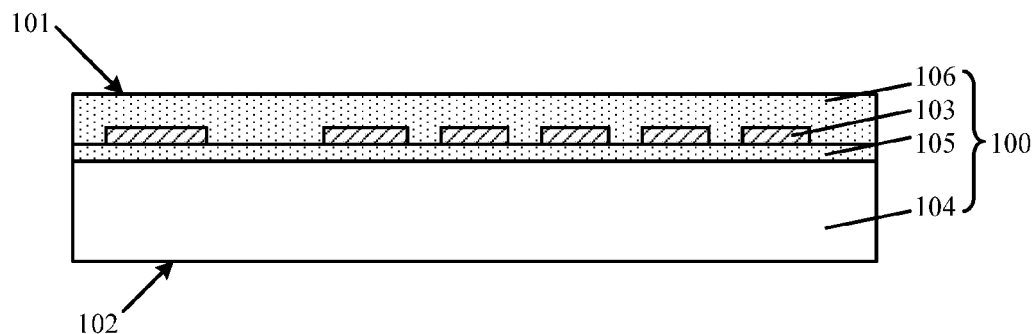
FIGS. 1 to 9 are schematic cross-sectional diagrams of a MEMS pressure sensor in a fabrication process according to an embodiment of the present disclosure.

As described in the Background, in the existing methods for fabricating a MEMS pressure sensor, a process of integrating a pressure sensor chip with a signal processing circuit is complicated and the size of the formed device is large.

In an existing method for fabricating a MEMS pressure sensor, a pressure sensor chip and a signal processing circuit chip are fabricated separately, then are placed on a packaging substrate having a cavity, and are connected with each other using a wirebonding lead. The sensor chip and the signal processing circuit chip after being connected with each other are coated with a layer of protective gel. After the protective gel is coated, a plastic or metal cover is placed outside the protective gel for cover/sealing. In another existing embodiment, the pressure sensor chip and the signal processing circuit chip may be placed on a flat packaging substrate and connected with each other using the wirebonding lead, and then the pressure sensor chip and the signal processing circuit chip may be coated with a layer of protective soft gel and covered with a metal shell.

In fabricating the above MEMS pressure sensor, the pressure sensor chip and the signal processing circuit chip are arranged separately side by side on a surface of the packaging substrate. In this case, the formed MEMS pressure sensor has a large size, which cannot meet advanced miniaturization requirement for MEMS pressure sensors. Furthermore, after being placed on the packaging substrate, the pressure sensor chip and the signal processing circuit chip have to be protected using the protective gel and covered with the plastic or metal cover, therefore, the fabrication process is complicated and it is not easily compatible with monolithic integration using various integrated circuit fabrication processes.

In order to address the above issue, the present disclosure provides a MEMS pressure sensor and a method for forming the MEMS pressure sensor. In the method, a first substrate including a conductive layer and a second substrate including a piezoresistive element are prepared. The conductive layer is arranged on the side of a first surface of the first substrate and the piezoresistive element is arranged on the side of a third surface of the second substrate. A stacked structure of the first substrate and the second substrate may be formed by bonding the first surface of the first substrate and the third surface of the second substrate with each other. The conductive layer may be used to transmit an electrical signal output from the piezoresistive element. After a second base is removed or thinned and a fifth surface opposite to the third surface is formed, a first conductive plug passing through the second substrate from the fifth surface of the second substrate to the conductive layer is formed to electrically connect the conductive layer and the piezoresistive element. Since the first conductive plug is exposed in the fifth surface of the second substrate, it is easy to subsequently form a first conductive structure, which is electrically connected to the piezoresistive element, at the top of the first conductive plug, and thus the piezoresistive element is electrically connected to the conductive layer.

The conductive layer is formed in the first substrate, and the piezoresistive element is formed in the second substrate. The first substrate is stacked with the second substrate by bonding the first surface of the first substrate and the third surface of the second substrate with each other. In this case, it is avoided to form the conductive layer, the piezoresistive element overlapped with the conductive layer and a cavity between the piezoresistive element and a base in a layer by layer manner on a same base, thereby reducing the difficulty of processes and, in particular, reducing the difficulty of a process for forming the cavity. In addition, it is avoided that a temperature for forming the first substrate limits or affects a fabrication process of the second substrate. In this case, selection of materials and processes for the second substrate and the piezoresistive element is more flexible, and the performance of the formed piezoresistive element is improved.

Since the first surface of the first substrate bonds with the third surface of the second substrate in a large area, the overall strength of the first substrate and the second substrate stack is high. In this case, it is not easy to bend, break or deform the first substrate and the second substrate stack, thereby improving the reliability of the structure of the formed pressure sensor and improving the durability of the formed pressure sensor.

There is no extra space between the first surface of the first substrate and the third surface of the second substrate, except for the cavity formed between the conductive layer and the piezoresistive element. In this case, a distance between the fifth surface of the second substrate and the second surface of the first substrate is short, thereby reducing the size and a fabrication cost of the formed pressure sensor.

Furthermore, since the conductive layer is electrically connected to the piezoresistive element by forming the first conductive plug passing through the second substrate from the fifth surface of the second substrate to the conductive layer, no addiction conductive layer is necessary between the first surface of the first substrate and the third surface of the second substrate for the purpose of providing electrical connection, avoiding any negative impact that could be generated by the additional conductive layer. In addition, the selection of material of the first surface of the first substrate and material of the third surface of the second substrate is more flexible, and the processes of forming the first substrate and the second substrate are more flexible, and therefore the fabrication processes of the pressure sensor are more compatible with various integrated circuit fabrication processes, thereby reducing the fabrication cost.

In the following, specific embodiments of the present disclosure are described in detail in conjunction with the drawings, to make the above objects, features and advantages of the present disclosure more apparent.

First Embodiment

FIGS. 1 to 9 are schematic cross-sectional diagram of a MEMS pressure sensor in a fabrication process according to an embodiment of the present disclosure.

Referring to FIG. 1, a first substrate 100 is prepared. The first substrate 100 includes a first surface 101 and a second surface 102 opposite to the first surface 101, and the first substrate 100 includes at least one conductive layer 103 arranged on the side of the first surface 101 of the first substrate 100.

The conductive layer 103 is formed in the first substrate 100, and the conductive layer 103 is used to transmit an electrical signal output from a piezoresistive element in the second substrate. In the embodiment, the first substrate 100 further includes a circuit. The conductive layer 103 may be a conductive layer of the circuit, alternatively, may be a conductive layer added to the circuit. The conductive layer 103 may include a conductor or a semiconductor. The circuit may be used to transmit and process the electrical signal output from the piezoresistive element.

In the embodiment, the first substrate 100 includes a first base 104, a first dielectric layer 105 arranged on a surface of the first base 104, the conductive layer 103 arranged on a surface of the first dielectric layer 105, and a first coupling layer 106 arranged on the side of the first surface 101. In the embodiment, the conductive layer 103 has a single layer structure. In another embodiment, the conductive layer may include multiple conductive layers. In this case, a first conductive plug subsequently formed may be connected to at least one conducive layer.

The first base 104 includes a silicon substrate, a silicon germanium substrate, a silicon carbide substrate, a glass substrate or an III-V group compound substrate (such as a gallium nitride substrate or a gallium arsenide substrate).

The first dielectric layer 105 is used to electrically isolate the conductive layer 103 from the first base 104. The first dielectric layer 105 may be comprised of silicon oxide, silicon nitride, silicon oxynitride, low-k dielectric material (material with a dielectric constant in a range from 2.5 to 3.9) or ultra low-k dielectric material (material with a dielectric constant less than 2.5). The first dielectric layer 105 may be formed by an oxidation process, a chemical vapor deposition process, a physical vapor deposition process or an atomic layer deposition process.

The conductive layer 103 may be comprised of conductive material including metal, metal compound or semiconductor material doped with ions. The process of forming the conductive layer 103 includes: depositing a conductive material layer on a surface of the first dielectric layer 105; forming a patterned layer on a surface of the conductive material layer, with a portion of the surface of the conductive material layer being exposed from the patterned layer; and etching the conductive material layer with the patterned layer being a mask until the first dielectric layer 105 is exposed. The conductive material layer may be formed by a chemical vapor deposition process, a physical vapor deposition process or an atomic layer deposition process. The patterned layer is a patterned photoresist layer. The conductive material layer may be etched with a dry etching process.

The first coupling layer 106 protects the conductive layer 103, and is to be bonded with a second coupling layer of a surface of a second substrate subsequently, to bond the first substrate 100 and the second substrate with each other. The first coupling layer 106 has a flat surface, that is, the first surface 101 of the first substrate 100 is flat. A third surface of the second substrate prepared subsequently is also flat. In this case, a contact area between the first surface 101 and the third surface is large after the first surface 101 of the first substrate 100 and the third surface of the second substrate are bonded, the strength of a stacked structure of the first surface 101 and the second substrate is high and the first surface 101 is bonded with the second substrate more stably.

The first coupling layer 106 may be comprised of one or more of insulating material, metal material, metal compound material and semiconductor material. The insulating material includes silicon oxide, silicon nitride, silicon oxynitride, low-k dielectric material or ultra low-k dielectric material. The metal material includes one or more of copper, tungsten, aluminum, silver, titanium and tantalum. The metal compound material includes one or two of titanium nitride and tantalum nitride. The semiconductor material includes one or more of polycrystalline silicon, amorphous silicon, polycrystalline germanium, amorphous germanium, silicon germanium and silicon carbide which are doped with ions, and the ions being doped include one or more of p-type ions, n-type ions, carbon ions, nitrogen ions, fluoride ions and hydrogen ions.

In an embodiment, the first coupling layer 106 is comprised of silicon oxide. The process of forming the first coupling layer includes: depositing a first coupling film partially on a surface of the first dielectric layer 105 and partially on a surface of the conductive layer 103; and forming the first coupling layer 106 by flatting the first coupling film with a chemical mechanical polishing process.

In another embodiment, the first substrate 100 may not include the first coupling layer and the second substrate prepared subsequently may include a second coupling layer.

In addition, the first substrate 100 further includes a circuit including a semiconductor device structure and an electrical interconnection structure. The conductive layer 103 may be a conductive layer of the circuit, or, may be a conductive layer added to the circuit. The conductive layer 103 may include a conductor or a semiconductor.

In the embodiment, a second substrate is prepared. The second substrate includes a third surface and a fourth surface opposite to the third surface, and the second substrate includes a second base and a piezoresistive element arranged on or above the second base. The piezoresistive element is arranged on the side of the third surface of the second substrate. In the following, a fabrication process of the second substrate is described.

Figure 2:
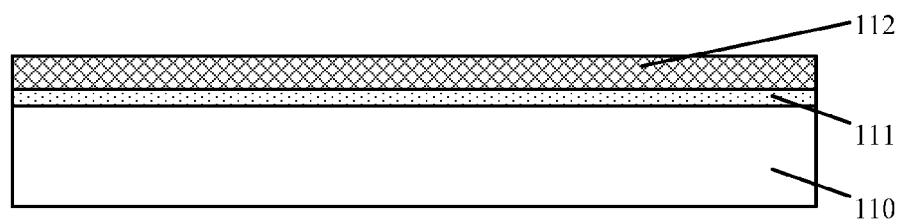

Referring to FIG. 2, a second base 110, a protective layer 111 arranged on a surface of the second base 110 and a piezoresistive element layer 112 arranged on a surface of the protective layer 111 are prepared.

In an embodiment, the second base 110, the protective layer 11 and the resistance element 112 are formed with a semiconductor-on-insulator substrate. Specifically, the semiconductor-on-insulator substrate is prepared, where the semiconductor-on-insulator substrate includes a base, an insulating layer arranged on a surface of the base and a semiconductor layer arranged on a surface of the insulating layer, the base is the second base 110 and the insulating layer is the protective layer 111.

The semiconductor-on-insulator substrate includes a silicon-on-insulator substrate. The protective layer may be comprised of silicon oxide, i.e. buried oxide layer (BOX). The piezoresistive element layer 112 may be comprised of monocrystalline silicon or monocrystalline germanium. Since the piezoresistive element layer 112 may be comprised of monocrystalline silicon which is doped with doping ions, a resistance of the formed piezoresistive element may change more due to a deformation of the piezoresistive element layer 112, that is, the sensitivity of the formed piezoresistive element is improved. In addition, in a case that the semiconductor layer of the semiconductor-on-insulator substrate directly serves as the piezoresistive element layer 112 and the insulating layer of the semiconductor-on-insulator substrate directly serves as the protective layer 111, no piezoresistive element layer 112 and no protective layer 111 are formed by an additional deposition process, thereby simplifying the fabrication process.

In another embodiment, the second base 110 is a body base. The body base includes a silicon substrate, a silicon germanium substrate, a silicon carbide substrate, a glass substrate or an III-V group compound substrate (such as a gallium nitride substrate or a gallium arsenide substrate).

The protective layer 111 and the piezoresistive element layer 112 are formed by a deposition process including a physical vapor deposition process, a chemical vapor deposition process or atomic layer deposition process. The protective layer 111 may be comprised of insulating material, which includes silicon oxide, silicon nitride, silicon oxynitride, low-k dielectric material or ultra low-k dielectric material. The piezoresistive element layer 112 may be comprised of a semiconductor material, and may include silicon, polycrystalline silicon, amorphous silicon, polycrystalline germanium, amorphous germanium, silicon carbide, gallium arsenide and silicon germanium.

Since the second base 110 is the body base, and the protective layer 111 and the piezoresistive element layer 112 are formed by deposition process, the second base 110, the protective layer 111 and the piezoresistive element layer 112 may be comprised of material of variety of selections, and meets more fabrication process needs.

Figure 3:
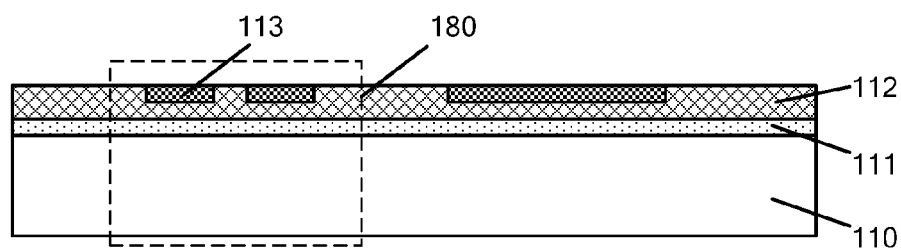

Referring to FIG. 3, ions are implanted into a portion of the piezoresistive element layer 112 to form a piezoresistive element 113 in the piezoresistive element layer 112.

In the embodiment, the second substrate includes the second base 110 and the piezoresistive element layer 112, and the second substrate includes a pressure sensing region 180 in which the piezoresistive element 113 is arranged. In addition, a doped interconnection layer is further formed in the piezoresistive element layer 112, and the doped interconnection layer is electrically connected to the piezoresistive element 113. A pressure sensing film is formed in the pressure sensing region 180 of the second substrate.

The forming the piezoresistive element 113 includes: forming a first patterned layer on a surface of the resistance element layer 112, with a portion of the surface of the resistance element layer 112 being exposed from the first patterned layer; implanting icons into the piezoresistive element layer 112 with the first patterned layer being a mask, to form a piezoresistive element 113 in the piezoresistive element layer 112; and removing the first patterned layer after the ions are implanted.

The first patterned layer is a patterned photoresist layer formed by a photolithography process. Alternatively, the first patterned layer may be a mask formed by a multi-pattern mask process, such as a Self-Aligned Double Patterning (abbreviated to SADP) mask. The first patterned layer may be removed with a dry etching process or a wet etching process.

The ions implanted in the ion implantation process may include p-type ions, n-type ions, carbon ions, nitrogen ions, fluoride ions and hydrogen ions. The p-type ions include boron ions or indium ions. The n-type ions include phosphorus ions or arsenic ions. A resistance and a pressure-sensitivity of the piezoresistive element 113 can be adjusted by adjusting a concentration of the implanted ions.

A piezoresistor, i.e. the piezoresistive element 113, may be formed in an implanted region by implanting ions into the piezoresistive element layer 112. The implanted region may be deformed under a pressure or a stress and a resistance of the implanted region may be changed due to the deformation. In this case, the formed piezoresistive element 113 may output an electrical signal changing as an external environment changes, and thus a MEMS pressure sensing chip is formed in the second substrate.

Figure 4:
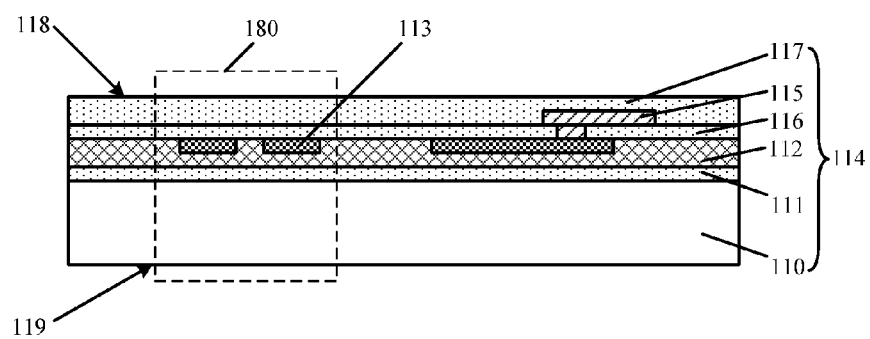

Referring to FIG. 4, a second conductive structure 115 electrically connected to the piezoresistive element 113 is formed.

In the embodiment, a doped interconnection layer is further formed in the piezoresistive element layer 112. The doped interconnection layer is electrically connected to the piezoresistive element 113 and the second conductive structure 115.

In the embodiment, a second dielectric layer 116 is arranged on a surface of the piezoresistive element layer 112. The second conductive structure 115 is arranged in the second dielectric layer and on a surface of the second dielectric layer. A second coupling layer 117 is arranged on a surface of the second conductive structure 115 and on the surface of the second dielectric layer 116. The second substrate 114 includes the second base 110, the protective layer 111, the piezoresistive element layer 112, the second dielectric layer 116, the second conductive structure 115 and the second coupling layer 117. The second substrate 114 includes a third surface 118 and a fourth surface 119. The third surface 118 is a surface of the second coupling layer 117 and the fourth surface 119 is a surface of the second base 110. The second substrate 114 includes a pressure sensing region 180 in which the piezoresistive element 113 is arranged.

After the first substrate 100 and the second substrate 114 are bonded with each other, the conductive layer 103 is electrically connected to the piezoresistive element 113 via a first conductive structure formed subsequently and a first conductive plug 123 passing through the second substrate 114 from a fifth surface of the second substrate 114 to the conductive layer 103.

The second conductive structure 115 includes a second conductive plug arranged on a surface of the piezoresistive element layer 112 and a second conductive layer arranged on a surface of the second conductive plug. The second conductive plug is formed in the second dielectric layer 116 and the second conductive layer is formed on the surface of the second dielectric layer 116. In the embodiment, the second conductive plug is formed on the doped interconnection layer.

The second dielectric layer 116 is formed on the surface of the piezoresistive element layer 112. The forming the second dielectric layer 116 includes: depositing a second dielectric film on the surface of the piezoresistive element layer 112; and etching the second dielectric film to form a second dielectric layer 116 including a second through hole. The second dielectric layer 116 may be comprised of silicon oxide, silicon nitride, silicon oxynitride, low-k dielectric material or ultra low-k dielectric material. The second dielectric film may be formed by a chemical vapor deposition process, a physical vapor deposition process or an atomic layer deposition process. The second dielectric film may be etched with an anisotropic dry etching process. The second through hole is adapted to form the second conductive plug.

The second conductive plug may be comprised of copper, tungsten, aluminum, silver or gold. The forming the second conductive plug includes: forming a conductive film partially on the surface of the second dielectric layer 116 and partially in the second through hole, with the second through hole being filled with the conductive film; and flatting the conductive film to form the second conductive plug. In addition, a second barrier layer may be further formed between the second conductive plug and the second dielectric layer 116, and the second barrier layer may be comprised of one or more of titanium, tantalum, titanium nitride and tantalum nitride.

The second conductive layer may be comprised of metal or metal compound, including one or more of cooper, tungsten, aluminum, silver, titanium, vanadium, titanium nitride and tantalum nitride. The forming the second conductive layer includes: depositing a conductive material layer on the surface of the second dielectric layer 116; forming a patterned layer on a surface of the conductive material layer, with a portion of the surface of the conductive material layer being exposed from the patterned layer; and etching the conductive material layer with the patterned layer being a mask until the surface of the second dielectric layer 116 is exposed. The conductive material layer may be formed by a chemical vapor deposition process, a physical vapor deposition process or an atomic layer deposition process. The patterned layer is a patterned photoresist layer. The conductive material layer may be etched with an anisotropic dry etching process.

The second substrate 114 further includes the second coupling layer 117 arranged on the side of the third surface 118. In the embodiment, the second coupling layer 117 is arranged on the surface of the second dielectric layer 116 and on the surface of the second conductive structure 115. The second coupling layer 117 is used to protect the second conductive structure 115 and is to be bonded with the first coupling layer 106 (as shown in FIG. 1), so as to bond the first substrate 100 (as shown in FIG. 1) and the second substrate with each other. A surface of the second coupling layer 117 is flat, that is, the third surface 118 of the second substrate 114 is flat. In another embodiment, only the first substrate 100 includes a coupling layer or only the second substrate 114 includes a second coupling layer 117.

The second coupling layer 117 may be comprised of one or more of an insulating material, a metal material, a metal compound material and a semiconductor material. The insulating material includes silicon oxide, silicon nitride, silicon oxynitride, low-k dielectric material or ultra low-k dielectric material. The metal material includes one or more of copper, tungsten, aluminum, silver, titanium and tantalum. The metal compound material includes one or two of titanium nitride and tantalum nitride. The semiconductor material includes one or more of polycrystalline silicon, amorphous silicon, polycrystalline germanium, amorphous germanium, silicon germanium and silicon carbide which are doped with ions. The ions being doped include one or more of p-type ions, n-type ions, carbon ions, nitrogen ions, fluoride ions and hydrogen ions.

In an embodiment, the second coupling layer 117 may be comprised of silicon oxide. The forming the second coupling layer 117 includes: depositing a second coupling film partially on the surface of the second dielectric layer 116 and partially on the surface of the second conductive structure 115; and forming a second coupling layer 117 by flattening the second coupling film with the chemical mechanical polishing process.

At least one of the first coupling layer 106 and the second coupling layer 117 may be comprised of an insulating material. Alternatively, both the surface of the first coupling layer 106 of the surface of the second coupling layer 117 may be comprised of insulating material. In the embodiment, after the first substrate 100 and the second substrate 114 are bonded with each other, a first conductive plug passing through the second substrate 114 from the fifth surface of the second substrate 114 to a surface of the conductive layer 103 is formed, and the conductive layer 103 is electrically connected to the piezoresistive element 113 via the first conductive plug and a subsequently formed first conductive structure. Therefore, no conductive structure is further formed between a surface of the first coupling layer 106 and a surface of the second coupling layer 117 which contact with each other, and no conductive material is used to make the surfaces of the first coupling layer 106 and the second coupling layer 117. In this case, the first coupling layer 106 and the second coupling layer 117 may be comprised of various types of material, which meets more fabrication process needs.

In another embodiment, the second substrate may not include a second coupling layer, and the first substrate 100 includes a first coupling layer.

Figure 5:
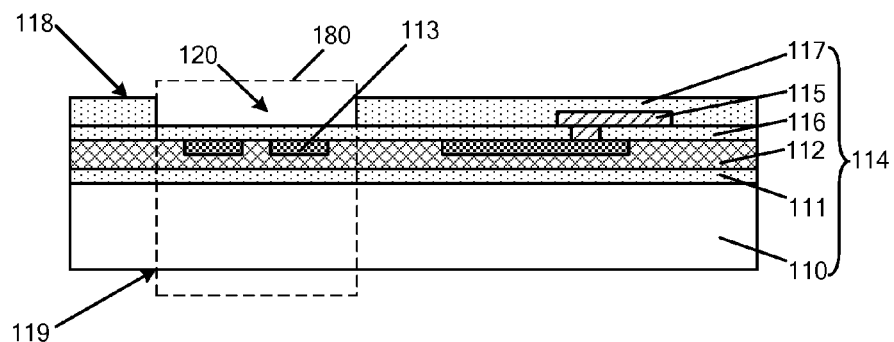

Referring to FIG. 5, a first opening 120 is formed from the third surface 118 of the second substrate 114, and a location of the first opening 120 corresponds to a location of the pressure sensing region 180.

The first opening 120 is formed in the pressure sensing region 180. When the first substrate 100 and the second substrate 114 are subsequently bonded with each other, a cavity can be formed with the first opening 120 and the first surface 101 of the first substrate 100. The cavity may be vacuum, or a pressure in the cavity may be one atmospheric pressure or other preset pressure values. The cavity may serve as a pressure reference cavity of the MEMS pressure sensor. In a case that the first substrate 100 and the second substrate 114 are bonded with each other and the second base 110 is removed, a difference value between a pressure applied to a surface of the protective layer 111 and the pressure in the pressure reference cavity may be acquired, so as to detect a pressure applied by the external environment to the protective layer 111.

The forming the first opening 120 includes: forming a patterned layer on a surface of the second coupling layer 117; and etching the second coupling layer 117 with the patterned layer being a mask to form a first opening 120 in the second coupling layer 117. The patterned layer may be a patterned photoresist layer. The etching process may be a dry etching process, a wet etching process or a combination thereof. In addition, a portion of the second dielectric layer 116 may be etched in the etching process, and the first opening 120 is formed with its bottom penetrating into the second dielectric layer 116.

In the embodiment, the surface of the piezoresistive element layer 112 is not exposed at the bottom of the first opening 120, and the second dielectric layer 116 located at the bottom of the first opening 120 can protect the surface of the piezoresistive element layer 112. In another embodiment, the surface of the piezoresistive element layer 112 may be exposed at the bottom of the first opening 120.

In another embodiment, the first opening may be formed on the side of a first surface of a first substrate, and a location of the first opening corresponds to a location of a pressure sensing region of a second substrate. In another embodiment, a first opening may be respectively formed on the side of the first surface of the first substrate and the side of a third surface of the second substrate, with locations of the first openings corresponding to the location of the pressure sensing region.

Figure 6:
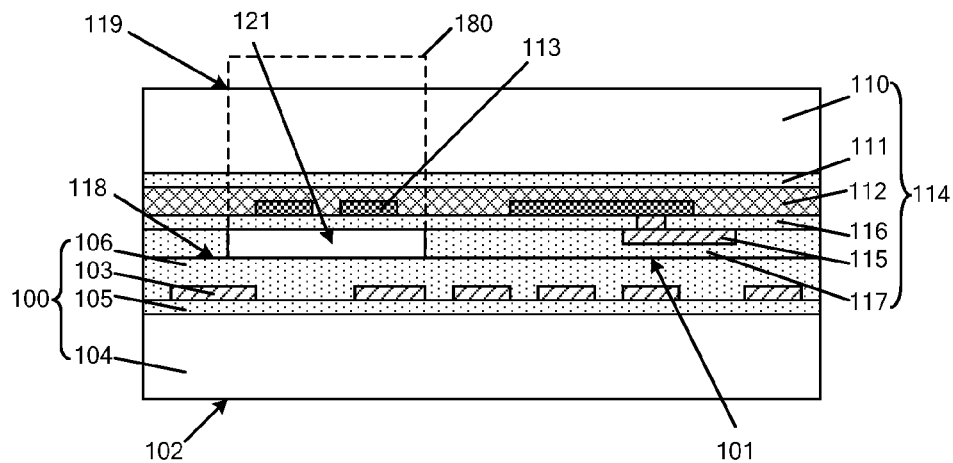

Reference is made to FIG. 6. The first surface 101 of the first substrate 100 and the third surface 118 of the second substrate 114 are bonded with each other, and a cavity 121 is formed between the first substrate 100 and the pressure sensing region 180 of the second substrate 114.

In the embodiment, since the first opening 120 is formed from the third surface 118 of the second substrate 114 (as shown in FIG. 5), the cavity 121 is formed with the first opening 120 and the first surface 101 of the first substrate 100 when the first surface 101 of the first substrate 100 and the third surface 118 of the second substrate 114 are bonded with each other.

In another embodiment, a first opening may be formed by etching the first surface 101 of the first substrate 100, with a location of the first opening corresponding to the pressure sensing region 180 in the second substrate 114. In this case, a cavity 121 is formed with the first opening and the third surface 118 of the second substrate 114 when the first surface 101 of the first substrate 100 and the third surface 118 of the second substrate 114 are bonded with each other.

In an embodiment, the first substrate 100 and the second substrate 114 may be bonded by a direct-bonding process, such as Fusion Bonding, Anodic Bonding, Eutectic Bonding or Thermal Compression Bonding. In another embodiment, the first substrate 100 and the second substrate 114 may be bonded with each other by an adhesive bonding process, and the first substrate 100 and the second substrate 114 are bonded with an adhesive bonding layer. The adhesive bonding layer may be comprised of insulating material, semiconductor material, metal material or organic material. The first or second coupling layer serves as the adhesive bonding layer.

In the embodiment, the surface of the first coupling layer 106 is flat, and the surface of the second coupling layer 117 is flat. The surface of the first coupling layer 106 is the first surface of the first substrate 100, and the surface of the second coupling layer 117 is the third surface of the second substrate 114. The surface of the first coupling layer 106 directly contacts and is bonded with the surface of the second coupling layer 117, so that the first substrate 100 and the second substrate 114 are overlapped and bonded with each other.

The cavity 121 between the first substrate 100 and the pressure sensing region 180 of the second substrate 114 is formed as a pressure reference cavity, in a case that the first substrate 100 and the second substrate 114 are bonded with each other. The pressure in the formed cavity 121 can be adjusted by adjusting an ambient pressure in bonding the first substrate 100 and the second substrate 114. After the second base 110 is removed, a pressure difference exists between the pressure applied to the surface of the protective layer 111 and the pressure in the cavity 121. The pressure difference leads to a deformation in the pressure sensing region 180 of the second substrate 114, which leads to a change in the resistance of the piezoresistive element 113. In this case, a voltage output from the piezoresistive element 113 is changed. Therefore, an output electrical signal is changed as the pressure difference between the external pressure and the pressure in the cavity 121 changes, and an external pressure signal is detected.

The first surface 101 of the first substrate 100 directly contacts with the third surface 118 of the second substrate 114, and the first surface 101 and the third surface 118 are flat. Therefore, the first surface 101 contacts with the third surface 118 in a large area, a bonding strength between the first substrate 100 and the second substrate 114 is high, and it is not easy to bend, break or deform a stacked structure of the first substrate 100 and the second substrate 114, thereby providing a more stable and reliable structure of the formed pressure sensor and improving the durability of the formed pressure sensor.

Furthermore, except for the formed cavity 121, the first surface 101 of the first substrate 100 is mostly in contact with the third surface 118 of the second substrate 114, and there is no extra space between the first surface 101 and the third surface 118. In this case, a distance from the fourth surface 119 of the second substrate 114 to the second surface 102 of the first substrate 100 is short, thereby reducing a thickness and a size of the formed MEMS pressure sensor and improving device integration.

In addition, no additional conductive layer is arranged between the first surface 101 of the first substrate 100 and the third surface 118 of the second substrate 114, since the conductive layer 103 is electrically coupled to the piezoresistive element 113 by forming the first conductive plug passing through the second substrate 114 from the fifth surface of the second substrate 114 to the conductive layer 103. In this way, no or minimal stress is generated between the first surface 101 and the third surface 118 due to a thermal expansion coefficient mismatch, thereby improving the accuracy of the electrical signal output from the piezoresistive element 113.

The selection of material of the first surface 101 of the first substrate 100 and the material of the third surface 118 of the second substrate 114 is more flexible, hence the first surface 101 and the third surface 118 may be comprised of materials with no or less thermal expansion coefficient mismatch. In this case, no excessive stress is generated due to a large thermal expansion coefficient mismatch between the material of the first surface and the material of the third surface 118, thereby improving the reliability and the accuracy the formed MEMS pressure sensor. In addition, the processes for forming the first substrate 100 and the second substrate 114 are more flexible, the fabrication process of the formed MEMS pressure sensor is compatible with various fabrication processes of integrated conductive layers, and the fabrication cost is reduced.

Figure 7:
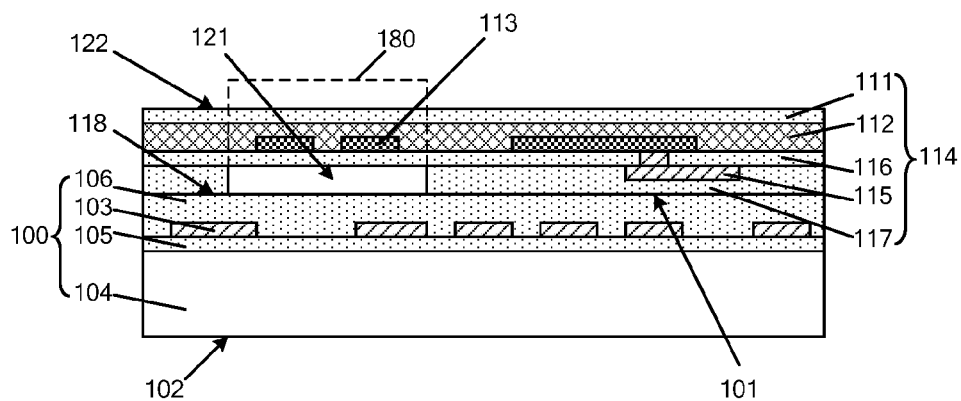

Reference is made to FIG. 7. The second base 110 (as shown in FIG. 6) is removed and a fifth surface 122 opposite to the third surface 118 of the second substrate 114 is formed.

In the embodiment, since the protective layer 111 is arranged between the second base 110 and the piezoresistive element layer 112, a surface of the protective layer 111 is exposed after the second base 110 is removed. The protective layer 111 is comprised of insulating material, and can protect and isolate the piezoresistive element layer 112. The resistance of the piezoresistive element 113 changes due to a deformation of the piezoresistive element 113 in a case that the protective layer 111 is affected by a pressure.

The second base 110 may be removed with a chemical mechanical polishing process or an etching process. The etching process includes a dry etching process, a wet etching process or a combination of dry etching and wet etching. Since the second base 110 is removed from the fourth surface 119 of the second substrate 114, a fifth surface 122, i.e. the surface of the protective layer 111, is formed on the side of the second substrate 114 facing way from the third surface 118 after the second base is removed.

Figure 8:
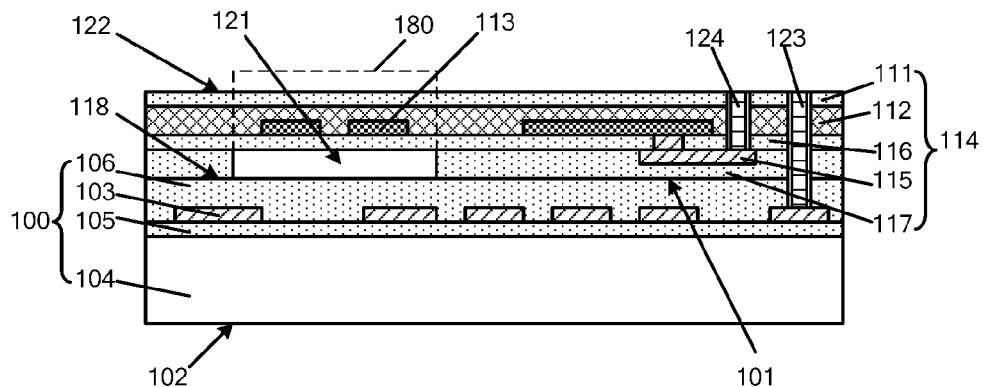

Reference is made to FIG. 8. A first conductive plug 123 passing through the second substrate 114 from the fifth surface 122 of the second substrate 114 to the at least one conductive layer 103 is formed, and the first conductive plug 123 is used to electrically connect the conductive layer 103 to the piezoresistive element 113.

The first surface 101 of the first substrate 100 is directly in contact with the third surface 118 of the second substrate 114, and no electrical connection is formed on the contacting interface between the first surface 101 and the third surface 118, and the formation of first conductive plug 123 is needed. One end of the first conductive plug 123 is electrically connected to the conductive layer 103 and the other end of the first conductive plug 123 is exposed in the fifth surface 122 of the second substrate. In this case, a first conductive structure may be directly formed on the fifth surface 122 and in the second substrate 114, so that a first conductive structure is electrically connected to the first conductive plug 123 and the piezoresistive element 113, and thus the conductive layer 103 is electrically connected to the piezoresistive element 113.

Since no additional electrical connection layer is formed at the bonding interface of the first surface 101 and the third surface 118, the first surface 101 contacts with the third surface 118 in most regions other than a region of the cavity 121, and a contact area between the first surface 101 and the third surface 118 is large. In this case, a mechanical strength of the first substrate 100 and the second substrate 114 is higher after they are bonded, and the stacked structure of the first substrate and the second substrate is more difficult to bend or crack. In addition, no additional electrical connection layer is formed at the bonding interface of the first surface 101 and the third surface 118, the first surface 101 and the third surface 118 may be comprised of material with similar thermal expansion coefficients. In this case, no excess stress or delamination is generated between the first substrate 100 and the second substrate 114 due to a thermal expansion coefficient mismatch, after the first substrate 100 contacts with the second substrate 114. Therefore, the stacked structure of the first substrate 100 and the second substrate 114 has a more reliable structure, a reduced size and a high adaptability of the fabrication process thereof.

The forming the first conductive plug 123 includes: forming a patterned layer on the fifth surface 122 of the second substrate 114, with a region where the first conductive plug 123 is formed being exposed from the patterned layer; with the patterned layer as a mask, etching the protective layer 111, the piezoresistive element layer 112, the second dielectric layer 116, the second coupling layer 117 and the first coupling layer 106 until the surface of the conductive layer 103 is exposed, to form a first through hole in the protective layer 111, the piezoresistive element layer 112, the second dielectric layer 116, the second coupling layer 117 and the first coupling layer 106; forming a conductive film partially on the fifth surface 122 and partially in the first through hole, with the first through hole being filled with the conductive film; and removing a portion of the conductive film on the fifth surface 122 until the fifth surface 122 is exposed. In an embodiment, the conductive film on the fifth surface may be removed completely. In another embodiment, a portion of the conductive film may be reserved on the fifth surface 122.

An end of the first conducive plug 123 may protrude from, be recessed into or be flush with, the fifth surface 122 of the second substrate 114.

In the embodiment, the first conductive plug 123 passes through the piezoresistive element layer 112, and the piezoresistive element layer 112 may be comprised of a semiconductor material. In this case, in order to electrically isolate the first conductive plug 123 from the piezoresistive element layer 112, an insulating layer is formed on a surface of a sidewall of the first through hole before the conductive film is formed, and then the conductive film filling up the first through hole is formed after the insulating layer is formed.

The first conductive plug 123 may be comprised of copper, tungsten, aluminum, silver or gold. The conductive film may be formed by a physical vapor deposition process, a chemical vapor deposition process, an atomic layer deposition process, an electroplating process or a chemical plating process. The conductive film may be flattened by a chemical mechanical polishing process. In addition, a first barrier layer may be formed on the surface of the sidewall of the first through hole, the conductive film is formed on a surface of the first barrier layer, and the first barrier layer may be comprised of one or more of titanium, tantalum, titanium nitride and tantalum nitride.

In the embodiment, a third conductive plug 124 passing through the second substrate 114 from the fifth surface 122 of the second substrate 114 to the second conductive layer is formed while the first conductive plug 123 is formed. The third conductive plug 124 and a subsequently formed first conductive layer 125 form a first conductive structure. The first conductive plug 123 is electrically connected to the piezoresistive element 113 via the first conductive structure, and the piezoresistive element 113 is electrically connected to the conductive layer 103.

In the embodiment, a third through hole passing through the protective layer 111, the piezoresistive element layer 112 and the second dielectric layer 116 is formed while the first through hole is formed. A surface of the second conductive layer is exposed at the bottom of the third through hole. The conductive film is formed in the third through hole and fills up the third through hole, and then the third conductive plug 124 is formed in the third through hole.

The third conductive plug 124 passes through the piezoresistive element layer 112. In order to electrically isolate the third conductive plug 124 from the piezoresistive element layer 112, an insulating layer is formed on a surface of a sidewall of the third through hole before the conductive film is formed, and the conductive film is formed after the insulating layer is formed, with the conductive film filling up the third through hole.

In another embodiment, the third conductive plug 124 may be formed before or after the first conductive plug 123 is formed.

Figure 9:
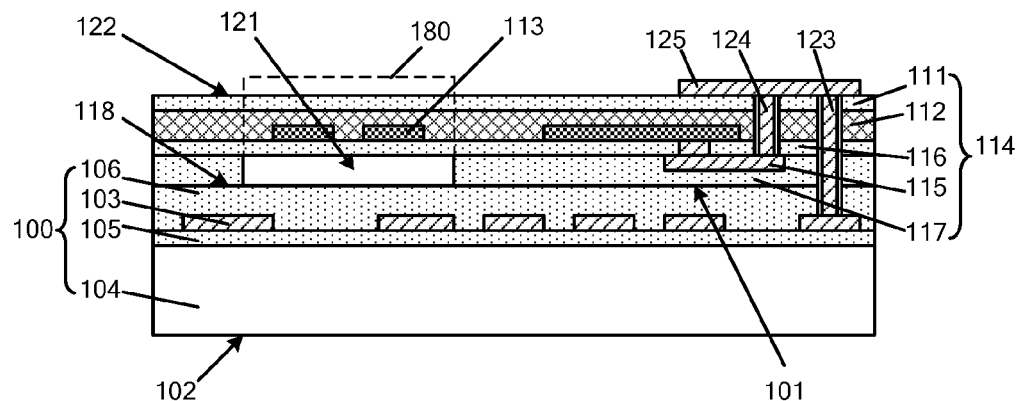

Referring to FIG. 9, a first conductive structure electrically connected to the first conductive plug 123 and the piezoresistive element 113 is formed.

In the embodiment, the first conductive structure includes the third conductive plug 124 and the first conductive layer 125. The first conductive layer 125 is arranged on the fifth surface 122 of the second substrate 114 and on top surfaces of the first conductive plug 123 and the third conductive plug 124. The third conductive plug 124 is electrically connected to the doped interconnection layer via the second conductive structure 115, the first conductive plug 123 is electrically connected to the conductive layer 103, the first conductive layer 125 is electrically connected to the first conductive plug 123 and the third conductive plug 124, and thus the piezoresistive element 113 is electrically connected to the conductive layer 103.

The first conductive layer 125 may be comprised of metal or metal compound, including one or more of copper, tungsten, aluminum, silver, titanium, tantalum, titanium nitride and tantalum nitride. The forming the first conductive layer 125 includes: depositing a conductive material layer on the fifth surface 122 of the second substrate 114; forming a patterned layer on the conductive material layer with a portion of the surface of the conductive material layer being exposed from the patterned layer; etching the conductive material layer with the patterned layer being a mask until the fifth surface 122 is exposed. The conductive material layer may be formed by a chemical vapor deposition process, a physical vapor deposition process or an atomic layer deposition process. The patterned layer is a patterned photoresist layer. The conductive material layer may be etched with an anisotropic dry etching process.

The method for fabricating the MEMS pressure sensor according to the embodiment may be used to make devices suitable for multiple types of packaging, including Chip Scale Package (CSP), Quad Flat No-lead package (QFN), Dual flat no-lead package (DFN) or Small Outline Integrated Conductive layer package (SOIC).

Accordingly, an embodiment of the present disclosure further provides a MEMS pressure sensor formed with the above method. Reference is still made to FIG. 9. The MEMS pressure sensor includes: a first substrate 100 and a second substrate 114. The first substrate 100 includes a first surface 101 and a second surface 102 opposite to the first surface 101, and the first substrate 100 includes at least one conductive layer 103 arranged on the side of the first surface 101 of the first substrate 100. The second substrate 114 includes a third surface 118 and a fifth surface 122 opposite to the third surface 118, the second substrate 114 includes a piezoresistive element 113, and the second substrate 114 includes a pressure sensing region 180 in which the piezoresistive element 113 is arranged. The first surface 101 of the first substrate 100 and the third surface 118 of the second substrate 114 are bonded with each other and the a cavity 121 is formed between the first substrate 100 and the pressure sensing region 180 of the second substrate 114. A first conductive plug 123 passing through the second substrate 114 from the fifth surface 122 of the second substrate 114 to the at least one conductive layer 103 is formed, to electrically connect the conductive layer 103 and the piezoresistive element 113.

In the following, the above structure is described in detail.

The second substrate 114 further includes a protective layer 111 arranged on a surface of the piezoresistive element layer 112, and a surface of the protective layer 111 is the fifth surface 122. The protective layer 111 may be comprised of insulating material such as silicon oxide, silicon nitride, silicon oxynitride, low-k dielectric material or ultra low-k dielectric material.

The piezoresistive element layer 112 may be comprised of semiconductor material such as monocrystalline silicon, monocrystalline germanium, III-V group compound, II-VI group compound, polycrystalline silicon, amorphous silicon, polycrystalline germanium, amorphous germanium, silicon carbide or silicon germanium.

The first substrate 100 further includes a circuit. The second substrate 114 further includes a second conductive structure 115 electrically connected to the piezoresistive element 113. The first conductive structure is electrically connected to the second conductive structure 115. The second conductive structure 115 includes a second conductive plug arranged on a surface of the piezoresistive element layer 112 and a second conductive layer arranged on a top surface of the second conductive plug. A second dielectric layer 116 is arranged on the surface of the piezoresistive element layer 112, and the second conductive plug is arranged in the second dielectric layer 116.

The first conductive structure includes a third conductive plug 124 passing through the second substrate 114 from the fifth surface 122 of the second substrate 114 to the second conductive layer, and a first conductive layer 125 arranged on the fifth surface 122 of the second substrate 114. The first conductive layer is further arranged on top surfaces of the first conductive plug 123 and the third conductive plug 124.

The second substrate 114 further includes a second coupling layer 117 arranged on the side of the third surface 118; or, the first substrate 100 includes a first coupling layer 106 arranged on the side of the first surface 101; or, the second substrate 114 further includes a second coupling layer 117 arranged on the side of the third surface 118 and the first substrate 100 includes a first coupling layer 106 arranged on the side of the first surface 101. The first coupling layer 106 or the second coupling layer 117 may be comprised of one or more of insulating material, metal material, metal compound material and semiconductor material. In an embodiment, at least one of the first coupling layer 106 and the second coupling layer 117 is comprised of an insulating material.

In an embodiment, the first coupling layer 106 or the second coupling layer 117 is an adhesive bonding layer, which is comprised of an insulating material, a semiconductor material, a metal material or an organic material. In another embodiment, the first coupling layer 106 is a bonding layer; or, the second coupling layer 117 is a bonding layer; or, the first coupling layer 106 and the second coupling layer 117 are bonding layers.

Second Embodiment

Figure 10:
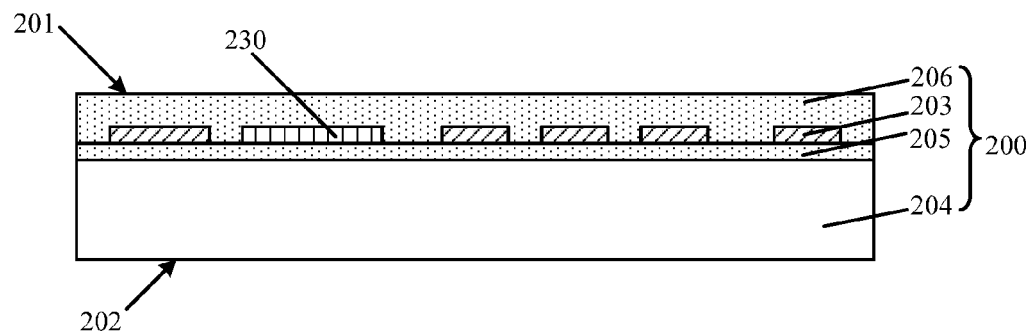
FIGS. 10 to 11 are schematic cross-sectional diagrams of a MEMS pressure sensor in a fabrication process according to an embodiment of the present disclosure.
Figure 11:
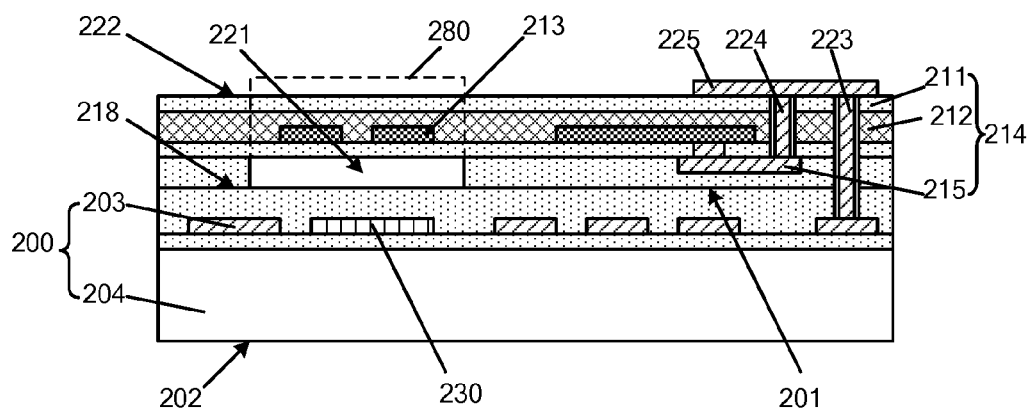

FIGS. 10 to 11 are schematic cross-sectional diagram of a MEMS pressure sensor in a fabrication process according to an embodiment of the present disclosure.

Referring to FIG. 10, a first substrate 200 is prepared. The first substrate 200 includes a first surface 201 and a second surface 202 opposite to the first surface 201, the first substrate 200 includes at least one conductive layer 203 arranged on the side of the first surface 201 of the first substrate 200, and a self-test electrode 230.

The first substrate 200 further includes a circuit including a semiconductor device structure and an electrical interconnection structure. The conductive layer 203 may be a conductive layer of the circuit, or, may be a conductive layer added to the circuit. The conductive layer may include a conductor or a semiconductor.

In the embodiment, the conductive layer 203 is formed on the first base 204, and a first dielectric layer is arranged between the conductive layer 203 and the first base 204. The first substrate 200 may include a first coupling layer 206 arranged on the side of the first surface 201. The first base 204, the first dielectric layer, the conductive layer 203 and the first coupling layer 206 are the same as those described in conjunction with FIG. 1 according to the previous embodiment, which are not described herein.

A location of the self-test electrode 230 corresponds to a location of a pressure sensing region of a second substrate. The self-test electrode 230 is formed on a surface of the first dielectric layer. The location of the self-test electrode 230 corresponds to the location of the pressure sensing region in the second substrate, that is, the self-test electrode 230 is arranged corresponding to the pressure sensing region after the first substrate 200 and the second substrate are bonded with each other. In the embodiment, the self-test electrode 230 is in a same layer as the conductive layer 203. In another embodiment, the self-test electrode 230 may be higher or lower than the conductive layer 203.

After the first substrate 200 and the second substrate are bonded, the self-test electrode 230 may generate an electrostatic pull on the pressure sensing region of the second substrate when a bias voltage is applied to the self-test electrode 230, and the electrostatic pull may lead to a deformation on the pressure sensing region of the second substrate. It is detected whether a piezoresistive element works normally by detecting whether the electrostatic pull leads to a change in a resistance of the piezoresistive element.

The self-test electrode 230 may be comprised of metal, metal compound or semiconductor material doped with ions. The forming the self-test electrode 230 includes: depositing an electrode material layer on a surface of a first dielectric layer 205; forming a patterned layer on a surface of the electrode material layer, with a portion of the surface of the electrode material layer being exposed from the patterned layer; etching the electrode material layer with the patterned layer being a mask until the surface of the first dielectric layer 205 is exposed. The electrode material layer may be formed by a chemical vapor deposition process, a physical vapor deposition process or an atomic layer deposition process. The patterned layer is a patterned photoresist layer. The electrode material layer may be etched by an anisotropic dry etching process. In the embodiment, the self-test electrode 230 and the conductive layer 203 are formed simultaneously. In another embodiment, the self-test electrode may be formed before or after the conductive layer 203 is formed.

Reference is made to FIG. 11. A second substrate 214 is prepared. The second substrate 214 includes a third surface 218 and a fourth surface opposite to the third surface 218, the second substrate 214 includes a second base and a piezoresistive element 213 arranged on or above the second base, and the second substrate 214 includes a pressure sensing region 280 in which the piezoresistive element 213 is arranged. The piezoresistive element 213 is arranged on the side of the third surface 218 of the second substrate 214. The first surface 201 of the first substrate 200 and the third surface 218 of the second substrate 214 are bonded with each other, and a cavity 221 is formed between the first substrate and the pressure sensing region 280 of the second substrate 214. The second base is removed to form a fifth surface 222 opposite to the third surface 218 of the second substrate 214. A first conductive plug 223 passing through the second substrate 214 from the side of the fifth surface 222 of the second substrate 214 to the at least one conductive layer 203 is formed, and the first conductive plug 223 is used to electrically connect the conductive layer 203 to the piezoresistive element 213.

In the embodiment, after the first surface 201 of the first substrate 200 and the third surface 218 of the second substrate 214 are bonded with each other, the location of the self-test electrode 230 corresponds to the location of the pressure sensing region 280. In this case, the self-test electrode 230 can apply an electrostatic pull to the piezoresistive element 213 to detect whether the piezoresistive element works normally.

In the embodiment, the second substrate 214 further includes a protective layer 211, a second conductive structure 215 and a first conductive structure. The first conductive structure includes a third conductive plug 224 and a first conductive layer 225.

Steps of: preparing the second substrate 214; bonding the first substrate 200 and the second substrate 214 with each other; removing the second base; forming the first conductive plug 223 and forming the first conductive structure are the same as those described in conjunction with FIGS. 2 to 9 according to the previous embodiment, which are not described herein.

Accordingly, the embodiment of the present disclosure further provides a MEMS pressure sensor formed with the above method. Reference is still made to FIG. 11. The MEMS pressure sensor includes a first substrate 200 and a second substrate 214. The first substrate 200 includes a first surface 201 and a second surface 202 opposite to the first surface 201, the first substrate 200 includes at least one conductive layer 203 arranged on the side of the first surface 201 of the first substrate 200 and a self-test electrode 230. The second substrate 214 includes a third surface 218 and a fifth surface 222 opposite to the third surface 218, the second substrate 214 includes a piezoresistive element 213 and a pressure sensing region 280 in which the piezoresistive element is arranged. The first surface 201 of the first substrate 200 and the third surface 218 of the second substrate 214 are bonded with each other and the a cavity 221 is formed between the first substrate 200 and the pressure sensing region 280 of the second substrate 214. The location of the self-test electrode 230 corresponds to the location of the pressure sensing region 280 of the second substrate 214. A first conductive plug 223 passing through the second substrate 214 from the fifth surface 222 of the second substrate 214 to the at least one conductive layer 203 is formed, and the first conductive plug 223 is used to electrically connect the conductive layer 203 and the piezoresistive element 213.

The first substrate 200, the second substrate 214, the piezoresistive element 213, the first conductive plug 223 and the first conductive structure are the same as those described in the previous embodiment, which are not described herein.

The self-test electrode 230 may be comprised of metal material, metal compound material or semiconductor doped with ions. The metal material includes one or more of copper, tungsten, aluminum, silver, titanium and tantalum. The metal compound material includes one or two of titanium nitride and tantalum nitride. The semiconductor material includes one or more of polycrystalline silicon, amorphous silicon, polycrystalline germanium, amorphous germanium, silicon germanium and silicon carbide which are doped with ions. The ions being doped include p-type ions, n-type ions, carbon ions, nitrogen ions, fluoride ions and hydrogen ions.

When a bias voltage is applied to the self-test electrode 230, the self-test electrode 230 can generate an electrostatic pull on the piezoresistive element 213, and the electrostatic pull may deform a pressure sensing film. It may be detected whether the piezoresistive element 213 works normally by detecting whether the electrostatic pull leads to a change in a resistance of the piezoresistive element 213.

Third Embodiment

FIGS. 12 to 15 are schematic cross-sectional diagrams of a MEMS pressure sensor in a fabrication process according to an embodiment of the present disclosure.

Figure 12:
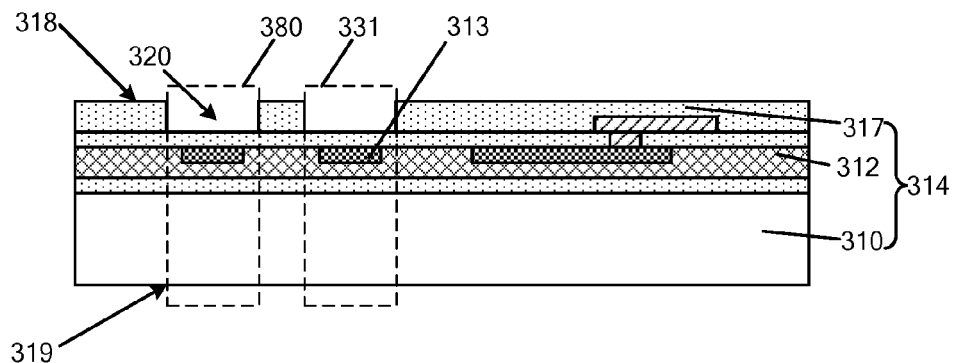
FIGS. 12 to 15 are schematic cross-sectional diagrams of a MEMS pressure sensor in a fabrication process according to an embodiment of the present disclosure.

Referring to FIG. 12, a second substrate 314 is prepared. The second substrate 314 includes a third surface 318 and a fourth surface 319 opposite to the third surface 318, the second substrate 314 includes a second base 310 and piezoresistive elements 313 arranged on or above the second base 310, the second substrate 314 includes a pressure sensing region 380 and a reference unit region 331. The piezoresistive elements 313 are arranged on the side of the third surface 318 of the second substrate 314. The piezoresistive elements 313 are respectively arranged in the pressure sensing region 380 and the reference unit region 331.

In the embodiment, the second substrate 314 further includes a second coupling layer 317 arranged on the side of the third surface 318 of the second substrate 314, and the second coupling layer 317 has first openings 320. The first openings 320 are respectively formed in the pressure sensing region 380 and the reference unit region 331. The first openings 320 are used to form cavities respectively in the pressure sensing region 380 and the reference unit region 331 after a first substrate and the second substrate 314 are bonded.

The second substrate 314 and the piezoresistive element 313 are the same as those described in conjunction with FIGS. 2 to 5 according to the previous embodiment, which are not describe herein.

Figure 13:
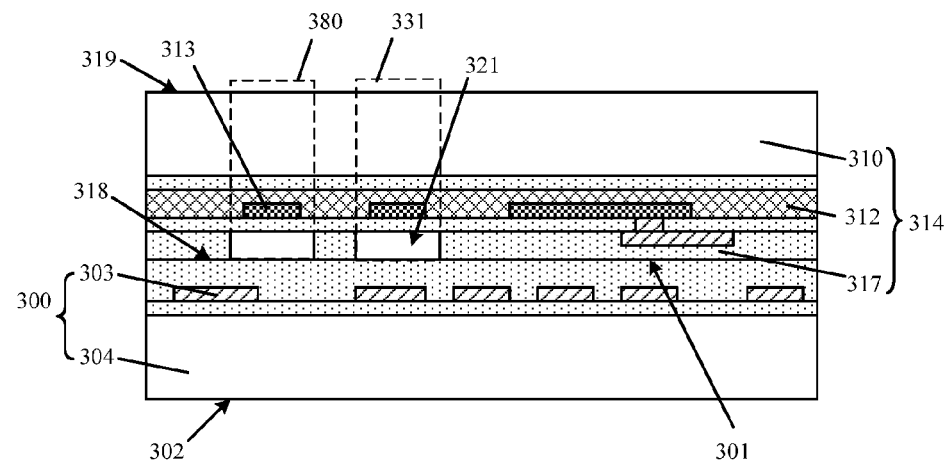

Referring to FIG. 13, a first substrate 300 is prepared. The first substrate 300 includes a first surface 301 and a second surface 302 opposite to the first surface 301, and the first substrate 300 includes at least one conductive layer 303 arranged on the side of the first surface 301 of the first substrate 300. The first surface 301 of the first substrate 300 and the third surface 318 of the second substrate 314 are bonded with each other. A cavity 321 is formed between the first substrate 300 and the pressure sensing region 380 of the second substrate 314, and a cavity 321 is formed between the first substrate 300 and the reference unit region 331 of the second substrate 314. A deformation on a portion of the second substrate 314 corresponding to the reference unit region 331 is less than a deformation on a portion of the second substrate 314 corresponding to the pressure sensing region 380 under a same external pressure.

A first base 304 is the same as that described in conjunction with FIG. 1 according to the previous embodiment, which is not described herein. A step of bonding the first surface 301 of the first substrate 300 and the third surface 318 of the second substrate 314 with each other is the same as the step described in conjunction with FIG. 6 according to the previous embodiment, which is not described herein.

The pressure sensing region 380 of the second substrate 314 and the reference unit region 331 of the second substrate 314 respectively include the first openings in the second coupling layer 317. In this case, the cavities 321 may be formed respectively in the pressure sensing region 380 and the reference unit region with the first openings and the first surface 301 of the first substrate 300.

Since a cover layer is to be formed in a later step on a portion of the fifth surface of the second substrate 314 corresponding to the reference unit region, a change in a resistance of the piezoresistive element 313 in the reference unit region 331 due to an external pressure can be reduced or avoided, and the resistance of the piezoresistive element 313 in the reference unit region 331 may be changed due to factors other than a pressure. An electrical signal generated only due to the external pressure can be obtained by subtracting an electrical signal output from the piezoresistive element 313 in the reference unit region 331 from an electrical signal output from the piezoresistive element 313 in the pressure sensing region 380. Therefore, the accuracy of the formed MEMS pressure sensor is improved.

Figure 14:
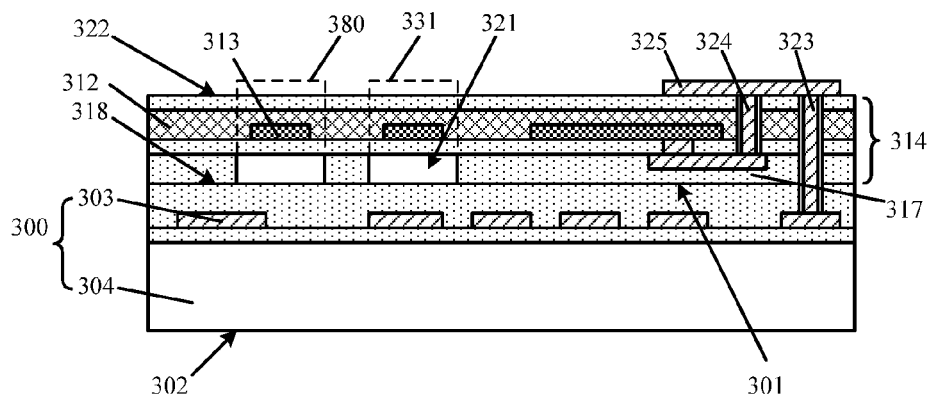

Referring to FIG. 14, the second base 310 (shown in FIG. 13) is removed to form a fifth surface 322 opposite to the third surface 318 of the second substrate 314. A first conductive plug 323 passing through the second substrate 314 from the fifth surface 122 of the second substrate 314 to the at least one conductive layer 303 is formed. The first conductive plug 323 is used to electrically connect the conductive layer 303 to the piezoresistive element 313.

In the embodiment, a first conductive structure includes the third conductive plug 324 and the first conductive layer 325.

A step of removing the second base 310 is the same as the step described in conjunction with FIG. 7 according to the previous embodiment, which is not described herein. Steps of forming the first conductive plug 323 and the first conductive structure are the same as steps described in conjunction with FIGS. 8 and 9 according to the previous embodiment, which are not described herein.

Figure 15:
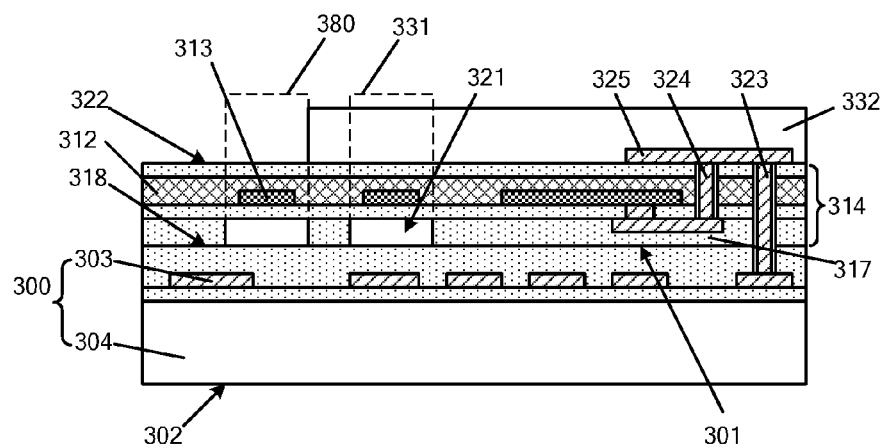

Referring to FIG. 15, a cover layer 332 is formed on a portion of the fifth surface 322 of the second substrate 314 corresponding to the reference unit region 331, after the second base 310 (as shown in FIG. 13) is removed.

The cover layer 331 is comprised of insulating material, and may have a high mechanical stiffness. The cover layer 332 can protect the piezoresistive element 313 in the reference unit region 331 from being affected by an external pressure.

The forming the cover layer 332 includes: depositing a cover film partially on the fifth surface 322 and partially on a surface of the first conductive structure; forming a patterned layer on a surface of the cover film; and etching the cover film with the patterned layer being a mask until a portion of the fifth surface 322 arranged in the pressure sensing region 380 is exposed. The cover layer 232 may be comprised of one or more of silicon oxide, silicon nitride, silicon oxynitride, amorphous carbon, polycrystalline silicon, amorphous silicon, polycrystalline germanium and amorphous germanium. The cover film may be formed by a chemical vapor deposition process, a physical vapor deposition process or an atomic layer deposition process. The cover film may be etched with an anisotropic dry etching process.

Since the cover layer 332 is formed on the fifth surface 322 of the second substrate 314 corresponding to the reference unit region 331, the resistance of the piezoresistive element 313 in the reference unit region 331 may show less or no change in response to an external pressure, but it may change due to factors other than pressure. An electrical signal generated due to the external pressure can be obtained by subtracting the electrical signal output by the piezoresistive element 313 in the reference unit region 331 from the electrical signal output by the piezoresistive element 313 in the pressure sensing region 380.

Accordingly, the embodiment of the present disclosure further provides a MEMS pressure sensor formed with the above method. Reference is still made to FIG. 15, the MEMS pressure sensor includes a first substrate 300 and the second substrate 314. The first substrate 300 includes a first surface 301 and a second surface 302 opposite to the first surface 301, and the first substrate 300 includes at least one conductive layer 30 arranged on the side of the first surface 301 of the first substrate 300. The second substrate 314 includes a third surface 318 and a fifth surface 322 opposite to the third surface 318, the second substrate 314 includes piezoresistive elements 313, and the second substrate 314 includes a pressure sensing region 380 and a reference unit region 331. The piezoresistive elements 313 are respectively arranged in the pressure sensing region 380 and the reference unit region 331. The first surface 301 of the first substrate 300 and the third surface 318 of the second substrate 314 are bonded with each other. A cavity 321 is formed between the first substrate 300 and the pressure sensing region 380 of the second substrate 314, and a cavity 321 is formed between the first substrate 300 and the reference unit region 331 of the second substrate 314. A first conductive plug 323 passing through the second substrate 314 from the fifth surface 322 of the second substrate 314 to the at least one conductive layer 303 is formed, and a first conductive structure electrically connected to the first conductive plug 323 and the piezoresistive elements 313 is formed. The first conductive plug 323 is used to electrically connect the conductive layer 303 to the piezoresistive element 313.

The cover layer 332 may be comprised of one or more of silicon oxide, silicon nitride, silicon oxynitride, amorphous carbon, polycrystalline silicon, amorphous silicon, polycrystalline germanium and amorphous germanium.

The first substrate 300, the second substrate 314, the piezoresistive element 313, the conductive layer 303, the first conductive plug 323 and the first conductive structure are the same as those described in conjunction with FIG. 9 according to the previous embodiment, which are not described herein.

Fourth Embodiment

Figure 16:
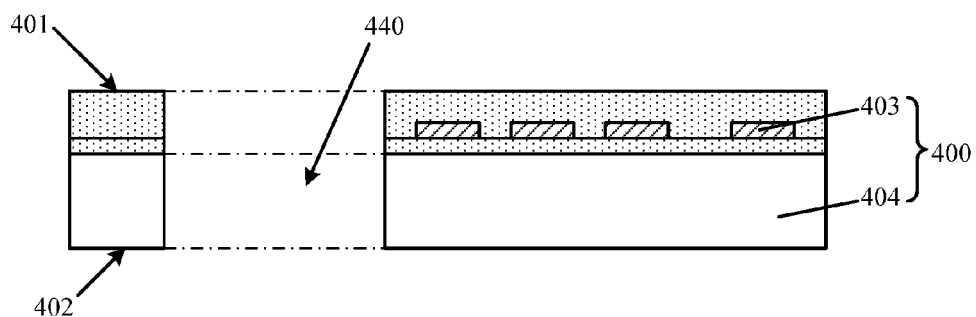
FIGS. 16 to 17 are schematic cross-sectional diagrams of a MEMS pressure sensor in a fabrication process according to an embodiment of the present disclosure.
Figure 17:
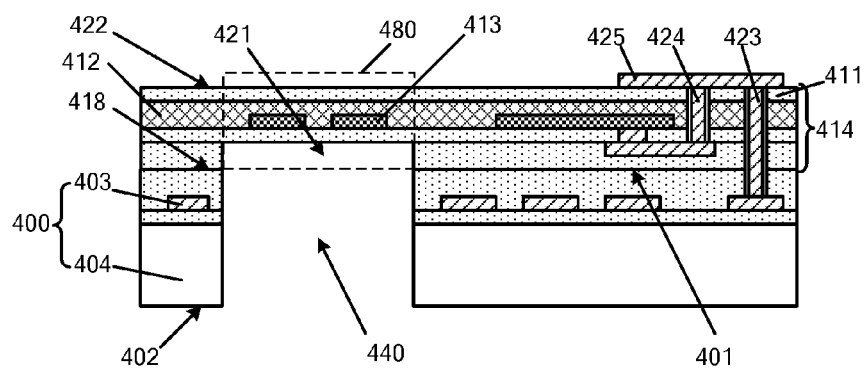

FIGS. 16 to 17 are schematic cross-sectional diagram of a MEMS pressure sensor in a fabrication process according to an embodiment of the present disclosure.

Referring to FIG. 16, a first substrate 400 is prepared. The first substrate 400 includes a first surface 401 and a second surface 402 opposite to the first surface 401, the first substrate 400 includes a first base 404 and at least one conductive layer 403 arranged on the side of the first surface 401 of the first substrate 400. A second opening 440 of the first substrate 400 is formed.

The forming the second opening 440 includes: forming a patterned layer on the second surface 402 of the first substrate 400, with a location where the second opening is to be formed being exposed from the patterned layer; etching the first substrate 400 with the patterned layer being a mask until the first substrate 400 is passed through, to form the second opening 440. The patterned layer is a patterned photoresist layer, and the etching process includes an anisotropic dry etching process.

The first substrate 400, and the first base 404 and the conductive layer 403 of the first substrate 400 are the same as those described in conjunction with FIG. 1 according to the previous embodiment, which are not described herein.

Referring to FIG. 17, a second substrate 414 is prepared. The second substrate 414 includes a third surface 418 and a fourth surface opposite to the third surface 418, the second substrate 414 includes a second base and a piezoresistive element 413 arranged on or above the second base, and the second substrate 414 includes a pressure sensing region 480 in which the piezoresistive element 413 is arranged. The piezoresistive element 413 is arranged on the side of the third surface 418 of the second substrate 414. The first surface 401 of the first substrate 400 and the third surface 418 of the second substrate 414 are bonded with each other, and a cavity 421 is formed between the first substrate 400 and the pressure sensing region 480 of the second substrate 414. The second base is removed to form a fifth surface 422 opposite to the third surface 418 of the second substrate 414. A first conductive plug 423 passing through the second substrate 414 from the side of the fifth surface 422 of the second substrate 414 to the at least one conductive layer 403 is formed, and the first conductive plug 423 is used to electrically connect the conductive layer 403 to the piezoresistive element 418.

In the embodiment, a first conductive structure electrically connected to the first conductive plug 423 and the piezoresistive element 413 is formed. The first conductive structure includes a third conductive plug 424 and a first conductive layer 425.

Material, structures and fabrication steps and fabrication processes of the second substrate 414 are the same as those described in conjunction with FIGS. 2 to 5 according to the previous embodiment; a step of bonding the first substrate 400 and the second substrate 414 with each other is the same as that described in conjunction with FIG. 6 according to the previous embodiment; a step of removing the second base is the same as that described in conjunction with FIG. 7 according to the previous embodiment; and steps of forming the first conductive plug 423 and the first conductive structure are the same as those described in conjunction with FIGS. 8 and 9 according to the previous embodiment, which are not described herein.

After the first surface 401 of the first substrate 400 and the third surface 418 of the second substrate 414 are bonded with each other, a location of the second opening 440 corresponds to a location of the pressure sensing region 480 of the second substrate. Therefore, the second opening 440 is in communication with the cavity 421, and two sides of the pressure sensing film are exposed to the external environment.

Since the second opening 440 is exposed to the external environment, pressures from the external environment are obtained on both sides of the pressure sensing film. In a case that the pressures on the two sides of the pressure sensing film are different, the pressure sensing film is deformed and a resistance of the piezoresistive element 413 is changed. Therefore, the piezoresistive element 413 according to the embodiment can acquire a differential pressure signal, and the formed MEMS pressure sensor serves as a differential pressure sensor.

Accordingly, the embodiment of the present disclosure further provides a MEMS pressure sensor formed with the above method. Reference is still made to FIG. 17. The MEMS pressure sensor includes a first substrate 400 and a second substrate 414. The first substrate 400 includes a first surface 401 and a second surface 402 opposite to the first surface 401, and the first substrate 400 includes at least one conductive layer 403 arranged on the side of the first surface 401 of the first substrate 400. The second substrate 414 includes a third surface 418 and a fifth surface 422 opposite to the third surface 418, and the second substrate 414 includes a piezoresistive element 413 and a pressure sensing region 480 in which the piezoresistive element is arranged. The first surface 401 of the first substrate 400 and the third surface 418 of the second substrate 414 are bonded with each other and a cavity 421 is formed between the first substrate 400 and the pressure sensing region 480 of the second substrate 414. A first conductive plug 423 passing through the second substrate 414 from the fifth surface 422 of the second substrate 414 to a surface of the at least one conductive layer 403 is formed, and the first conductive plug 423 is used to electrically connect the conductive layer 403 to the piezoresistive element 413.

In the embodiment, the MEMS pressure sensor further includes a first conductive structure electrically connected to the first conductive plug 423 and the piezoresistive element 413, and a second opening 440 passing through the first substrate 400. A location of the second opening 440 corresponds to a location of the pressure sensing region 480 of the second substrate 414.

Fifth Embodiment

Figure 18:
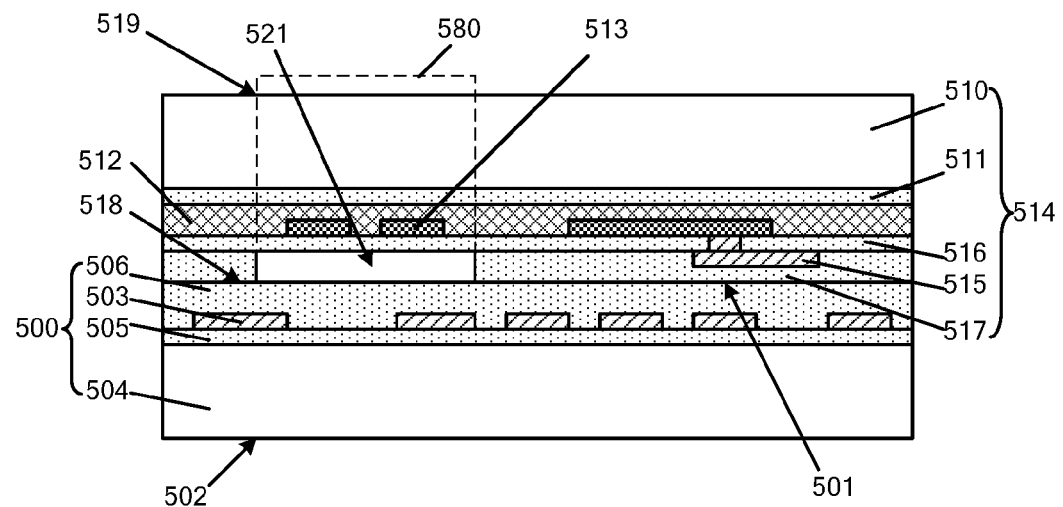
FIGS. 18 to 20 are schematic cross-sectional diagrams of a MEMS pressure sensor in a fabrication process according to an embodiment of the present disclosure.
Figure 19:
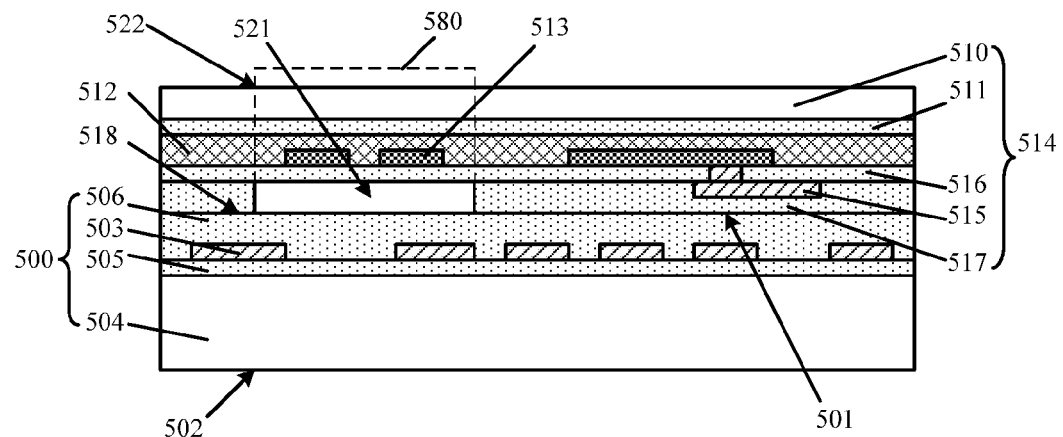
Figure 20:
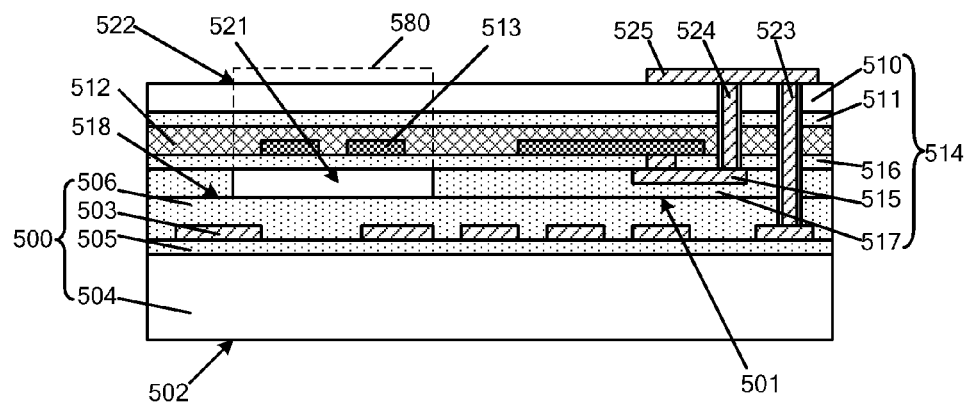

FIGS. 18 to 20 are schematic cross-sectional diagrams of a MEMS pressure sensor in a fabrication process according to an embodiment of the present disclosure.

Referring to FIG. 18, a first substrate 500 and a second substrate 514 are prepared. The first substrate 500 includes a first surface 501 and a second surface 502 opposite to the first surface 501, and the first substrate 500 includes at least one conductive layer 503 arranged on the side of the first surface 501 of the first substrate 500. The second substrate 514 includes a third surface 518 and a fourth surface 519 opposite to the third surface 518, the second substrate 514 includes a second base 510 and a piezoresistive element 513 arranged on or above the second base 510, and the second substrate 514 includes a pressure sensing region 580 in which the piezoresistive element is arranged. The piezoresistive element is arranged on the side of the third surface 518 of the second substrate 514. The first surface 501 of the first substrate 500 and the third surface 518 of the second substrate 514 are bonded with each other and a cavity 521 is formed between the first substrate 500 and the pressure sensing region 580 of the second substrate 514.

In the embodiment, the first substrate 500, the second substrate 514, and a step of bonding the first substrate 500 and the second substrate 514 are the same as those described in conjunction with FIGS. 1 to 6 according to the previous embodiment, which are not described herein.

In the embodiment, the first substrate 500 includes a first coupling layer 506 arranged on the side of the first surface 501.

In an embodiment, the first substrate 500 further includes a self-test electrode. A location of the self-test electrode corresponds to a location of the pressure sensing region 580 of the second substrate 514 after the first surface 501 of the first substrate 500 and the third surface 518 of the second substrate 514 are bonded with each other.

The second substrate 514 further includes a protective layer 511 arranged between the second base 510 and the piezoresistive element 513. In an embodiment, the forming the second substrate 514 includes: preparing a semiconductor-on-insulator substrate, which includes a base, an insulating layer arranged on a surface of the base and a semiconductor layer arranged on the insulating layer; forming a first patterned layer on a surface of the semiconductor layer, with a portion of the surface of the semiconductor layer being exposed from the first patterned layer; implanting ions into the semiconductor layer with the first patterned layer being a mask to form a piezoresistive element 513 in the semiconductor layer, where the base is the second base 510 and the insulating layer is the protective layer 511; and removing the first patterned layer after the ions are implanted. In another embodiment, the second base 510 may be a body base.

The second substrate 514 further includes a second conductive structure 515 electrically connected to the piezoresistive element 513. The second conductive structure 515 includes a second conductive plug connected to a doped interconnection layer in a piezoresistive element layer and a second conductive layer arranged on a top surface of the second conductive plug.

The second substrate 514 further includes a second coupling layer 517 arranged on the side of the third surface 518. In an embodiment, at least one of the first coupling layer 506 and the second coupling layer 517 may be comprised of an insulating material.

In an embodiment, the second substrate 514 further includes a sensing unit region and a reference unit region, and cavities 521 are respectively formed in the sensing unit region and the reference unit region.

In an embodiment, the forming the cavity 521 includes: forming a first opening from the third surface 518 of the second substrate 514 before the first surface 501 of the first substrate 500 and the third surface 518 of the second substrate 514 are bonded with each other, with a location of the first opening corresponding to a location of the pressure sensing region 580 of the second substrate 514; and forming a cavity 521 with the first opening and the first surface 501 of the first substrate 500 when the first surface 501 of the first substrate 500 and the third surface 518 of the second substrate 514 are bonded with each other.

In an embodiment, a second opening passing through the first substrate 500 is further formed. A location of the second opening corresponds to a location of the pressure sensing region 580 of the second substrate 514 after the first surface 501 of the first substrate 500 and the third surface 518 of the second substrate 514 are bonded with each other.

In an embodiment, the first surface 501 of the first substrate 500 and the third surface 518 of the second substrate 514 may be bonded with each other by a direct-bonding process. In another embodiment, the first surface 501 of the first substrate 500 and the third surface 518 of the second substrate 514 may be bonded with each other by an adhesive bonding process, the first coupling layer 506 or the second coupling layer 517 is an adhesive bonding layer which may be comprised of an insulating material, a semiconductor material, a metal material or an organic material.

Referring to FIG. 19, the second substrate 514 is thinned from the fourth surface 519 (shown in FIG. 18) by partially removing the second base 510, to form a fifth surface 522 opposite to the third surface 518 of the second substrate 514.

The second substrate 514 may be thinned from the fourth surface 519 by a chemical mechanical polishing process. In the embodiment, the fourth surface 519 of the second substrate 514 is a surface of the second base 510, and hence the second base is thinned by the chemical mechanical polishing process. The piezoresistive element 513 and the protective layer 511 are protected by a portion of the second base 510 not being removed and arranged on a surface of the protective layer 511, after the second base 510 is thinned.

In an embodiment, the second substrate 514 further includes a sensing unit region and a reference unit region, and cavities 521 are respectively formed in the sensing unit region and the reference unit region, and a cover layer is formed on a portion of the fifth surface 522 of the second substrate 514 corresponding to the reference unit region after the second base 510 is thinned.

Referring to FIG. 20, a first conductive plug 523 passing through the second substrate 514 from the side of the fifth surface 522 of the second substrate 514 to the at least one conductive layer 503 is formed, and the first conductive plug 523 is used to electrically connect the conductive layer 503 to the piezoresistive element 513.

The first conductive plug 523 electrically connects the conductive layer 503 to the piezoresistive element 513 via a first conductive structure. The first conductive structure includes a third conductive plug passing through the second substrate 514 from the fifth surface 522 of the second substrate 514 to a second conductive layer, and a first conductive layer 525 arranged on the fifth surface 522 of the second substrate and on top surfaces of the first conductive plug 523 and the third conductive plug 524. In the embodiment, the first conductive structure is electrically connected to the second conductive structure 515 in the first substrate 500, and is electrically connected to the piezoresistive element 513. An insulating layer may further be formed between the first conductive layer 525 and the second base 510.

Material, structures and fabrication steps of the first conductive structure and material, structures and fabrication steps of the first conductive plug 523 are the same as those described in conjunction with FIGS. 8 and 9 according to the previous embodiment, which are not described herein.

Accordingly, the embodiment of the present disclosure further provides a MEMS pressure sensor formed with the above method. Reference is still made to FIG. 20. The MEMS pressure sensor includes a first substrate 500 and a second substrate 514. The first substrate 500 includes a first surface 501 and a second surface 502 opposite to the first surface 501, and the first substrate 500 includes at least one conductive layer 503 close to the first surface 501 of the first substrate 500. The second substrate 514 includes a third surface 518 and a fifth surface 522 opposite to the third surface 518, the second substrate 514 includes a second base 510 and a piezoresistive element 513 arranged on or above the second base 510, and the second substrate 514 includes a pressure sensing region 580 in which the piezoresistive element 513 is arranged. The piezoresistive element 513 is arranged on the side of the third surface 518 of the second substrate 514. The first surface 501 of the first substrate 500 and the third surface 518 of the second substrate 514 are bonded with each other, and a cavity 521 is formed between the first substrate 500 and the pressure sensing region 580 of the second substrate 514. A first conductive plug 523 passing through the second substrate 514 from the side of the fifth surface 522 of the second substrate 514 to the at least one conductive layer 503 is formed, and the first conductive plug 523 is used to electrically connect the conductive layer 503 to the piezoresistive element 513.

In the following, the above structure is described in detail.

The second substrate 514 further includes a protective layer 511 arranged on a surface of a piezoresistive element layer 512, and a surface of the protective layer 511 is the fifth surface 522. The second substrate 514 further includes a second conductive structure 515 electrically connected to the piezoresistive element 513. A first conductive structure is electrically connected to the second conductive structure 515. The second conductive layer 515 includes a second conductive plug arranged on the surface of the piezoresistive element layer 512, and a second conductive layer arranged on a top surface of the second conductive plug.

The first conductive structure includes a third conductive plug 524 passing through the second substrate 514 from the fifth surface 522 of the second substrate 514 to the second conductive layer, and a first conductive layer 525 arranged on the fifth surface 522 of the second substrate 514. The first conductive layer is arranged on top surfaces of the first conductive plug 523 and the third conductive plug 524.

The second substrate 514 further includes a second coupling layer 517 arranged on the side of the third surface 518. Alternatively, the first substrate 500 includes a first coupling layer 506 arranged on the side of the first surface 501. Alternatively, the second substrate 514 further includes a second coupling layer 517 arranged on the side of the third surface 518 and the first substrate 500 includes a first coupling layer 506 arranged on the side of the first surface 501.

In an embodiment, at least one of the first coupling layer 506 and the second coupling layer 517 may be comprised of an insulating material.

In an embodiment, the first substrate 500 further includes a circuit.

In an embodiment, the first surface 501 of the first substrate 500 and the third surface 518 of the second substrate 514 are bonded with each other by an adhesive bonding process. The first coupling layer 506 or the second coupling layer 507 is an adhesive bonding layer which may be comprised of an insulating material, a semiconductor material, a metal material or an organic material.

Sixth Embodiment

Figure 21:
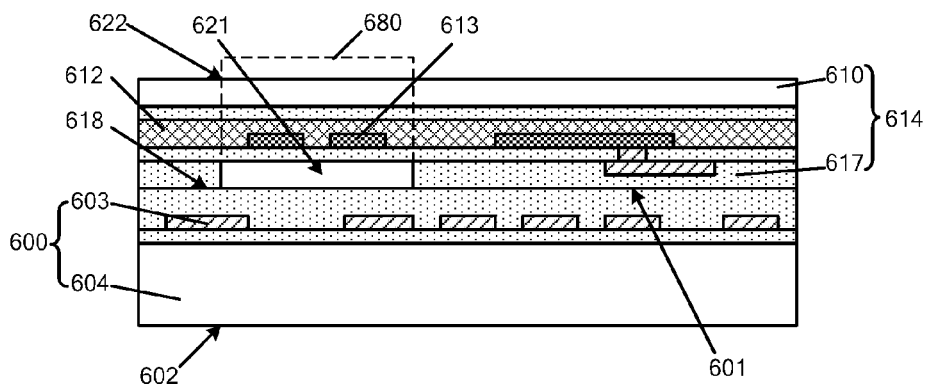
FIGS. 21 to 23 are schematic cross-sectional diagrams of a MEMS pressure sensor in a fabrication process according to an embodiment of the present disclosure.
Figure 22:
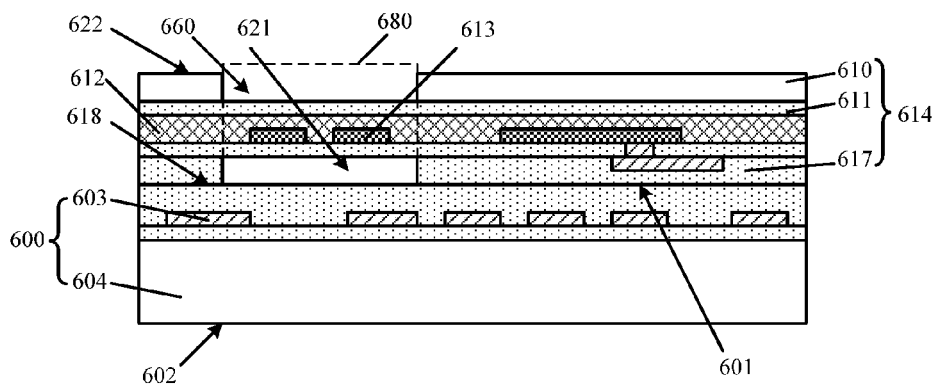
Figure 23:
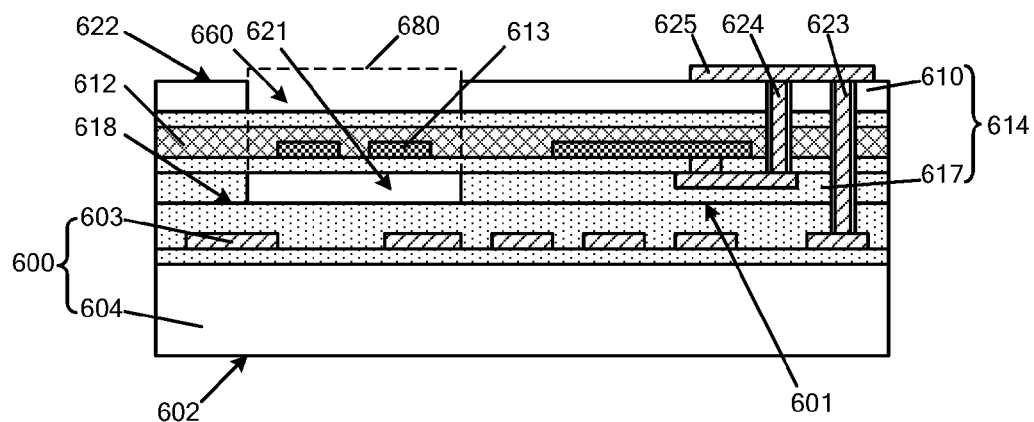

FIGS. 21 to 23 are schematic cross-sectional diagrams of a MEMS pressure sensor in a fabrication process according to an embodiment of the present disclosure.

Referring to FIG. 21, a first substrate 600 and a second substrate 614 are prepared. The first substrate 600 includes a first surface 601 and a second surface 602 opposite to the first surface 601, and the first substrate 600 includes a first base 604 and at least one conductive layer 603 arranged on the side of the first surface 601 of the first substrate 600. The second substrate 614 includes a third surface 618 and a fourth surface opposite to the third surface 618, the second substrate 614 includes a second base 610 and a piezoresistive element 613 arranged on or above the base 510, and the second substrate 614 includes a pressure sensing region 680 in which the piezoresistive element 613 is arranged. The piezoresistive element 613 is arranged on the side of the third surface 618 of the second substrate 614. The first surface 601 of the first substrate 600 and the third surface 618 of the second substrate 614 are bonded with each other and a cavity 621 is formed between the first substrate 600 and the pressure sensing region 680 of the second substrate 614. The second substrate 614 is thinned from the fourth surface by partially removing the second base 610, to form a fifth surface 622 opposite to the third surface 618 of the second substrate 614.

The second substrate 614 further includes a second coupling layer 617 on the side of the third surface 618. A step of bonding the first surface 601 of the first substrate 600 and the third surface 618 of the second substrate 614 with each other and a step of thinning the second substrate 614 from the fourth surface are the same as those described in conjunction with FIGS. 18 and 19 according to the previous embodiment, which are not described herein.

Referring to FIG. 22, a third opening 660 is formed in the second substrate 614 after the second substrate 614 is thinned from the fourth surface, and a location of the third opening 660 corresponds to a location of the pressure sensing region 680 of the second substrate 614.

The third opening 660 may pass through the second base 610, or may not pass through the second base 610.

In an embodiment, a third opening formed in the second substrate does not pass through the second base. Alternatively, at least one fifth through hole passing through the second base is formed on the side of the fifth surface of the second substrate, instead of forming a third opening in the second base, with a location of the fifth through hole corresponding to the pressure sensing region.

The second base having the fifth through hole may filter out dust in the air and may be used for an electric shielding. In addition, the second base arranged in the pressure sensing region may serve as a self-test electrode. In a case that a bias voltage is applied to the second base, the second base may generate an electrostatic pull on the piezoresistive element to detect whether the piezoresistor works normally.

The forming the third opening 660 includes: forming a patterned layer on the fifth surface 622 of the second substrate 614, with a location where a third opening 660 is to be formed being exposed from the patterned layer; and etching the fifth surface 622 of the second substrate 614 with the patterned layer being a mask, to form a third opening 660. The patterned layer is a patterned photoresist layer. The etching process includes an anisotropic dry etching process. In the embodiment, the protective layer 611 is exposed through the third opening 660.

Since a region other than the pressure sensing region 680 is covered by the second base 610, a distance from the piezoresistive element 613 to the external environment is lengthened without affecting an accuracy of detecting an external pressure by the piezoresistive element 613. In this case, the piezoresistive element 613 is protected, and a pressure sensing film and a protective layer 611 on the surface of the pressure sensing film is prevented from wears or other damages.

In an embodiment, the second substrate 614 further includes a sensing unit region and a reference unit region, and the cavities 621 are respectively formed in the sensing unit region and the reference unit region. In this case, only a surface region of the protective layer 611 corresponding to the sensing unit region is exposed through the third opening, and a surface region of the protective layer 611 corresponding to the reference unit region is still covered by the second base 610. Therefore, no additional cover layer is needed on or above the second base 610 for increasing the stiffness, and the second base 610 may serve as a cover layer on a surface of a pressure sensing region 612 arranged in the reference unit region.

Referring to FIG. 23, a first conductive plug 623 passing through the second substrate 614 from the side of the fifth surface 622 of the second substrate 614 to a surface of the at least one conductive layer 603 is formed, and the first conductive plug 623 is used to electrically connect the conductive layer 603 to the piezoresistive element 613.

Material, structures and forming steps of a first conductive structure and material, structures and forming steps of the first conductive plug 623 are the same as those described in conjunction with FIGS. 8 and 9 according to the previous embodiment, which are not described herein.

Accordingly, the embodiment of the present disclosure further provides a MEMS pressure sensor formed with the above method. Reference is still made to FIG. 23. The MEMS pressure sensor includes a first substrate 600 and a second substrate 614. The first substrate 600 includes a first surface 601 and a second surface 602 opposite to the first surface 601, and the first substrate 600 includes at least one conductive layer 603 close to the first surface 601 of the first substrate 600. The second substrate 614 includes a third surface 618 and a fifth surface 622 opposite to the third surface 618, the second substrate 614 includes a second base 610 and a piezoresistive element 613 arranged on or above the second base 610, and the second substrate 614 includes a pressure sensing region 680 in which the piezoresistive element 613 is arranged. The piezoresistive element 613 is arranged on the side of the third surface 618 of the second substrate 614. A third opening 660 is formed in the second substrate 614, and a location of the third opening 660 corresponds to the pressure sensing region 680 of the second substrate. The first surface 601 of the first substrate 600 and the third surface 618 of the second substrate 614 are bonded with each other, and a cavity 621 is formed between the first substrate 600 and the pressure sensing region 680 of the second substrate 614. A first conductive plug 623 passing through the second substrate 614 from the side of the fifth surface 622 of the second substrate 614 to the at least one conductive layer 603 is formed, and the first conductive plug 623 is used to electrically connect the conductive layer 603 to the piezoresistive element 613.

Seventh Embodiment

Figure 24:
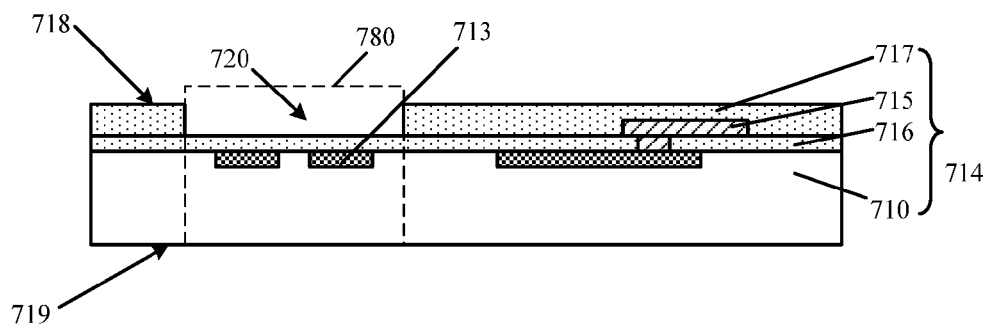
FIGS. 24 to 26 are schematic cross-sectional diagrams of a MEMS pressure sensor in a fabrication process according to an embodiment of the present disclosure.
Figure 25:
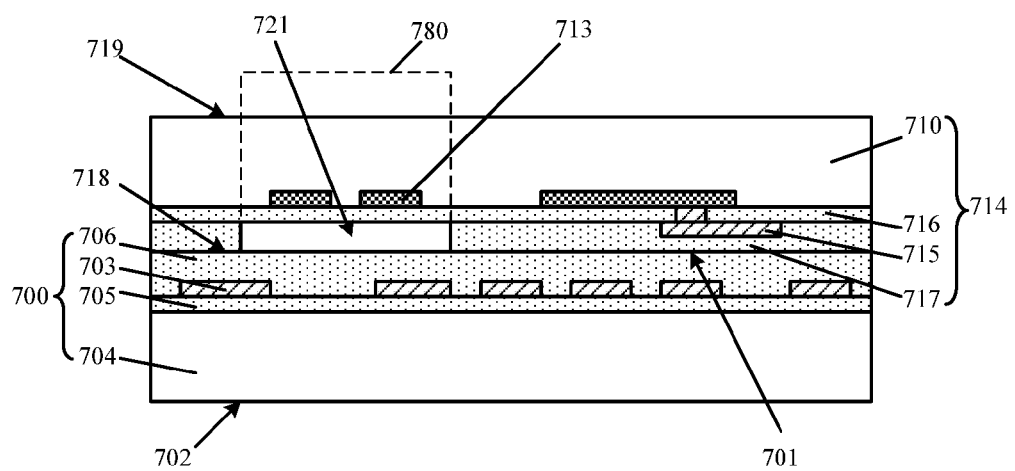
Figure 26:
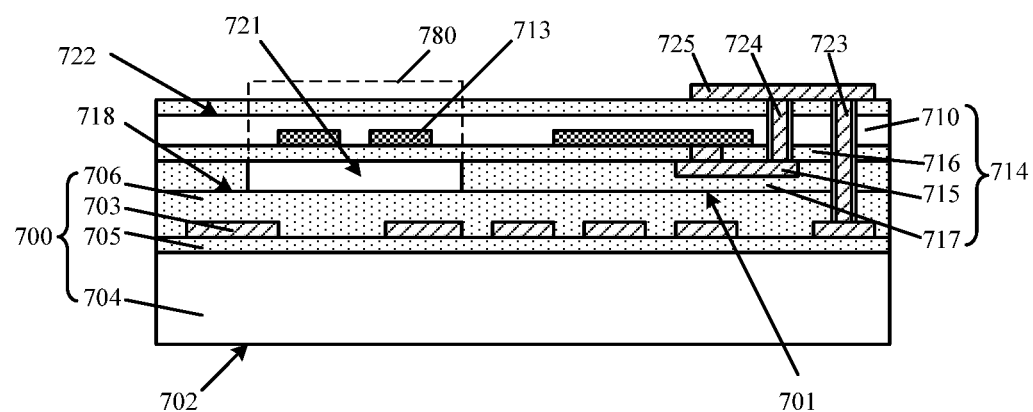

FIGS. 24 to 26 are schematic cross-sectional diagrams of a MEMS pressure sensor in a fabrication process according to an embodiment of the present disclosure.

Referring to FIG. 24, a second substrate 714 is prepared. The second substrate 714 includes a third surface 718 and a fourth surface 719 opposite to the third surface 718, the second substrate 714 includes a second base 710 and a piezoresistive element 713 arranged in the second base 710, and the second substrate 714 includes a pressure sensing region 780 in which the piezoresistive element 713 is arranged. The piezoresistive element 713 is arranged on the side of the third surface 718 of the second substrate 714.

In the embodiment, the second base 710 is a body base. A first patterned layer is formed on a surface of the body base, with a portion of the surface of the body base being exposed from the first patterned layer. Ions are implanted into the body base with the first patterned layer being a mask, to form a piezoresistive element 713 in the body base. The first patterned layer is removed after the ions are implanted. In addition, a doped interconnection layer electrically connected to the piezoresistive element 713 is further formed in the second base 710.

The second substrate 714 further includes a second conductive structure 715 electrically connected to the piezoresistive element 713. The second conductive structure 715 includes a second conductive plug connected to the doped interconnection layer in a piezoresistive element layer, and a second conductive layer arranged on a top surface of the second conductive plug.

The second substrate 714 further includes a second coupling layer 717 arranged on the side of the third surface 718. In the embodiment, a first opening 720 is formed in the second coupling layer 717 to form a cavity with a first substrate.

In an embodiment, the second substrate 714 further includes a sensing unit region and a reference unit region, and cavities are respectively formed in the sensing unit region and the reference unit region.

Referring to FIG. 25, a first substrate 700 is prepared. The first substrate 700 includes a first surface 701 and a second surface 702 opposite to the first surface 701, and the first substrate 700 includes at least one conductive layer 703 arranged on the side of the first surface 701 of the first substrate 700. The first surface 701 of the first substrate 700 and the third surface 718 of the second substrate 714 are bonded with each other, and a cavity 721 is formed between the first substrate 700 and the pressure sensing region 780 of the second substrate 714.

In the embodiment, the first substrate 700, the second substrate 714, and a step of bonding the first substrate 700 and the second substrate 714 are the same as those described in conjunction with FIGS. 1 to 6 according to the previous embodiment, which are not describe herein.

In the embodiment, the first substrate 700 includes a first coupling layer 706 on the side of the first surface 701. In an embodiment, at least one of the first coupling layer 706 and the second coupling layer 717 may be comprised of an insulating material.

In an embodiment, the first substrate 700 further includes a self-test electrode. A location of the self-test electrode corresponds to a location of the pressure sensing region 780 of the second substrate 714 after the first surface 701 of the first substrate 700 and the third surface 718 of the second substrate 714 are bonded with each other.

In an embodiment, the forming the cavity 721 includes: forming a first opening from the third surface 718 of the second substrate 714 before the first surface 701 of the first substrate 700 and the third surface 718 of the second substrate 714 are bonded with each other, with a location of the first opening corresponding to a location of the pressure sensing region 780; and forming a cavity 721 between the first opening and the first surface 701 of the first substrate 701 when the first surface 701 of the first substrate 700 and the third surface 718 of the second substrate 714 are bonded with each other.

In an embodiment, a second opening passing through the first substrate 700 is further formed. A location of the second opening corresponds to the location of the pressure sensing region 780 of the second substrate 714 after the first surface 701 of the first substrate 700 and the third surface 718 of the second substrate 714 are bonded with each other.

In an embodiment, the first surface 701 of the first substrate 700 and the third surface 718 of the second substrate 714 may be bonded with each other by a direct-bonding process. In another embodiment, the first surface 701 of the first substrate 700 and the third surface 718 of the second substrate 714 may be bonded with each other by an adhesive bonding process. The first coupling layer 706 or the second coupling layer 717 is an adhesive bonding layer which may be comprised of an insulating material, a semiconductor material, a metal material or an organic material.

Referring to FIG. 26, the second substrate 714 is thinned from the fourth surface 719 by partially removing the second base 710, to form a fifth surface 722 opposite to the third surface 718 of the second substrate 714. A first conductive plug 723 passing through the second substrate 714 from the side of the fifth surface 722 of the second substrate 714 to the at least one conductive layer 703 is formed, and the first conductive plug 723 is used to electrically connect the conductive layer 703 to the piezoresistive element 713.

The second substrate 714 may be thinned from the fourth surface 719 by a chemical mechanical polishing process. In the embodiment, the fourth surface 719 of the second substrate 714 is a surface of the second base 710, and hence the second base is thinned by the chemical mechanical polishing process.

In an embodiment, the second substrate 714 further includes a sensing unit region and a reference unit region, and cavities 721 are respectively formed in the sensing unit region and the reference unit region, a portion of the fifth surface 722 of the second substrate 714 corresponding to the reference unit region serves as a cover layer after the second base 710 is thinned.

A first conductive structure includes a third conductive plug passing through from the fifth surface 722 of the second substrate 714 to the second conductive layer, and a first conductive layer 725 arranged on the fifth surface 722 of the second substrate and on top surfaces of the first conductive plug 723 and the third conductive plug 724. In the embodiment, the first conductive structure is electrically connected to the second conductive structure 715 in the first substrate 700, and is electrically connected to the piezoresistive element 713. An insulating layer may be further formed between the first conductive layer 725 and the second base 710.

Material, structures and forming steps of the first conductive structure and material, structures and forming steps of the first conductive plug 723 are the same as those described in conjunction with FIGS. 8 and 9 according to the previous embodiment, which are not described herein.

Eighth Embodiment

Figure 27:
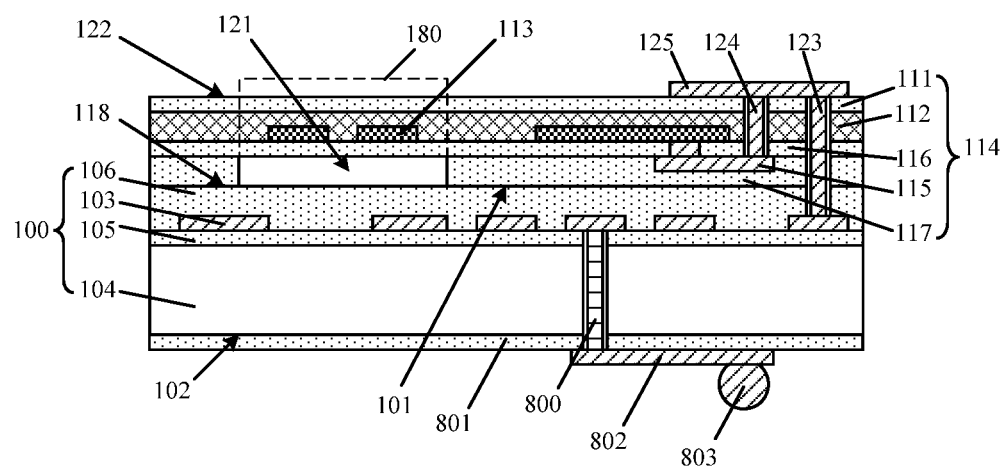
FIG. 27 is a schematic cross-sectional diagram of a MEMS pressure sensor in a fabrication process according to an embodiment of the present disclosure.

Based on FIG. 9, FIG. 27 is a schematic cross-sectional diagram of a MEMS pressure sensor in a fabrication process according to an embodiment of the present disclosure.

Referring to FIG. 27, a fourth conductive plug 800 passing through the first substrate 100 from the side of the second surface 102 of the first substrate 100 to the at least one conductive layer 103 is formed. The conductive layer 103 connected to the fourth conductive plug 800 and the conductive layer 103 connected to the first conductive plug 123 may be arranged in a same layer or different layers.

In the embodiment, the forming the fourth conductive plug 800 includes: forming a fourth dielectric layer 801 on the second surface of the first substrate 100, with a portion of the second surface 102 of the first substrate 100 being exposed from the fourth dielectric layer 801; etching the first substrate 100 with the fourth dielectric layer being a mask until at least one conductive layer 103 is exposed, to form a fourth through hole in the first substrate 100; and forming a fourth conductive plug 800 in the fourth through hole.

In the embodiment, before the fourth dielectric layer 801 is formed, the first substrate 100 may be thinned from the second surface 102, thereby reducing an etching depth and the difficulty of an etching process for forming the fourth through hole.

In the embodiment, after the fourth conductive plug 800 is formed, the method further includes: forming a fourth conductive layer 802 on a surface of the fourth dielectric layer, with the fourth conductive layer 802 being arranged on a top surface of the fourth conductive plug 800. In addition, a solder ball 803 may be formed on a surface of the fourth conductive layer 802, and the formed MEMS pressure sensor may be electrically connected to wires on a printed circuit board via the solder ball 803.

The fourth dielectric layer 801 is used to electrically isolate the fourth conductive layer 802 from the first substrate 104. The fourth dielectric layer 801 may be comprised of silicon oxide, silicon nitride, silicon oxynitride, low-k dielectric material or ultra low-k dielectric material. The fourth conductive layer 802 may be comprised of conductive material including metal material, metal compound material or semiconductor material doped with ions. The fourth through hole may be formed by an anisotropic dry etching process. The first substrate 100 may be thinned from the second surface 102 by a chemical mechanical polishing process.

The forming the fourth conductive plug 800 includes: forming a conductive film partially on or above the second surface 102 and partially in the fourth through hole, with the fourth through hole being filled with the conductive film; and removing a portion of the conductive film on or above the second surface 102 to form the fourth conductive plug 800. In an embodiment, the conductive film on or above the second surface 102 may be removed completely. In another embodiment, a portion of the conductive film may be reserved on the second surface 102.

An end of the fourth conductive plug 800 may protrude from, be recessed into or be flush with, the second surface 102.

In an embodiment, before the conductive film is formed, an insulating layer is formed on a surface of a sidewall of the fourth through hole, and then the conductive film filling up the fourth through hole is formed after the insulating layer is formed. The insulating layer is used to electrically isolate the conductive film from the first base 104.

The fourth conductive plug 800 may be comprised of copper, tungsten, aluminum, silver or gold. The conductive film may be formed by a physical vapor deposition process, a chemical vapor deposition process, an atomic layer deposition process, an electroplating process and a chemical plating process. The conductive film on the second surface 102 may be removed by a chemical mechanical polishing process. In addition, a first barrier layer may be formed on the surface of the sidewall of the fourth through hole and the conductive film is formed on a surface of the first barrier layer. The first barrier layer may be comprised of one or more of titanium, tantalum, titanium nitride and titanium nitride.

In another embodiment, before the first substrate and the second substrate are bonded with each other, a fourth conductive plug is formed from the side of the first surface 101 of the first substrate 100, that is, the fourth conductive plug may pass through the first substrate 100, or may not pass through the first substrate 100. In a case that the fourth conductive plug does not pass through the first substrate 100, after the fourth conductive plug is formed, the first substrate 100 is thinned from the second surface 102 until the fourth conductive plug is exposed. In the embodiment, the formed fourth conductive plug passes through the first substrate 100 from the second surface 102 of the first substrate 100 to at least one conductive layer 103 on the side of the first surface 101. The forming the fourth conductive plug includes: forming a fourth through hole on the side of the first surface 101 of the first substrate 100, with the bottom of the fourth through hole protrudes into the first base 104; forming a conductive film partially on the first surface 101 and partially in the fourth through hole, with the fourth through hole being filled with the conductive film; and removing a portion of the conductive film on the first surface 101 to form the fourth conductive plug. In an embodiment, an insulating layer is formed on the surface of a sidewall of the fourth through hole before the conductive film is formed, and then the conductive film filling up the fourth through hole is formed after the insulating layer is formed. The insulating layer is used to electrically isolate the conductive film from the first base 104.

Although the present disclosure is disclosed above, it is not intended to limit the present disclosure. Various changes and modifications may be made by those skilled in the art without departing from the spirit and scope of the present disclosure. Therefore, the scope of the present disclosure should be defined by the appended claims.

The invention claimed is:

1. A method for forming a Micro-Electro Mechanical System (MEMS) pressure sensor, comprising:
preparing a first substrate, wherein the first substrate comprises a first surface and a second surface opposite to the first surface, and the first substrate comprises at least one conductive layer arranged on the side of the first surface of the first substrate;
preparing a second substrate, wherein the second substrate comprises a third surface and a fourth surface opposite to the third surface, the second substrate comprises a second base and a piezoresistive element arranged on or above the second base, the second substrate comprises a pressure sensing region in which the piezoresistive element is arranged, and the piezoresistive element is arranged on the side of the third surface of the second substrate;
bonding the first surface of the first substrate and the third surface of the second substrate with each other;
forming a cavity between the first substrate and the pressure sensing region of the second substrate;
forming a fifth surface opposite to the third surface of the second substrate; and
forming a first conductive plug passing through the second substrate from the side of the fifth surface of the second substrate to the at least one conductive layer, wherein the first conductive plug is used to electrically connect the conductive layer to the piezoresistive element;
wherein a distance between the fifth surface and the third surface is less than a distance between the fourth surface and the third surface.

2. The method for forming the MEMS pressure sensor according to claim 1, wherein the first substrate further comprises a circuit.

3. The method for forming the MEMS pressure sensor according to claim 1, wherein the preparing the second substrate comprises: preparing a semiconductor-on-insulator substrate, wherein the semiconductor-on-insulator substrate comprises a base, an insulating layer on a surface of the base and a semiconductor layer on a surface of the insulating layer; and forming a piezoresistive element in the semiconductor layer, with the base being the second base; and
the forming a fifth surface opposite to the third surface of the second substrate comprises: removing the second base to form the fifth surface opposite to the third surface of the second substrate.

4. The method for forming the MEMS pressure sensor according to claim 1, wherein the second substrate further comprises a second coupling layer arranged on the side of the third surface; or, the first substrate comprises a first coupling layer arranged on the side of the first surface; or, the second substrate further comprises a second coupling layer arranged on the side of the third surface and the first substrate comprises a first coupling layer arranged on the side of the first surface.

5. The method for forming the MEMS pressure sensor according to claim 4, wherein at least one of the first coupling layer and the second coupling layer is comprised of an insulating material.

6. The method for forming the MEMS pressure sensor according to claim 4, wherein the first surface of the first substrate and the third surface of the second substrate are bonded with each other by an adhesive bonding process, and the first coupling layer or the second coupling layer is an adhesive bonding layer which is comprised of an insulating material, a semiconductor material, a metal material or an organic material.

7. The method for forming the MEMS pressure sensor according to claim 1, wherein the first surface of the first substrate and the third surface of the second substrate are bonded with each other by a direct-bonding process.

8. The method for forming the MEMS pressure sensor according to claim 1, wherein the forming the cavity comprises: forming a first opening before the first surface of the first substrate and the third surface of the second substrate are bonded with each other, wherein the first opening is arranged on the side of the third surface of the second substrate or the side of the first surface of the first substrate, or, the first opening is arranged on both the side of the first surface of the first substrate and the side of the third surface of the second substrate, with a location of the first opening corresponding to a location of the pressure sensing region.

9. The method for forming the MEMS pressure sensor according to claim 1, wherein the first substrate further comprises a self-test electrode, with a location of the self-test electrode corresponding to a location of the pressure sensing region after the first surface of the first substrate and the third surface of the second substrate are bonded with each other.

10. The method for forming the MEMS pressure sensor according to claim 1, wherein the second substrate further comprises a reference unit region, a cavity is further formed between the first substrate and the reference unit region of the second substrate when the first surface of the first substrate and the third surface of the second substrate are bonded with each other, and a deformation on a portion of the second substrate corresponding to the reference unit region is less than a deformation on a portion of the second substrate corresponding to the pressure sensing region under a same external pressure.

11. The method for forming the MEMS pressure sensor according to claim 1, further comprising: forming a second opening passing through the first substrate, wherein a location of the second opening corresponds to a location of the pressure sensing region of the second substrate after the first surface of the first substrate and the third surface of the second substrate are bonded with each other.

12. The method for forming the MEMS pressure sensor according to claim 1, further comprising: forming a fourth conductive plug passing through the first substrate from the side of the second surface of the first substrate to the at least one conductive layer.

13. The method for forming the MEMS pressure sensor according to claim 1, wherein the forming the fifth surface opposite to the third surface of the second substrate comprises:
thinning the second substrate from the fourth surface by partially removing the second base, to form a fifth surface opposite to the third surface of the second substrate.

14. The method for forming the MEMS pressure sensor according to claim 13, wherein the first substrate further comprises a circuit.

15. The method for forming the MEMS pressure sensor according to claim 13, wherein a third opening is formed in the second substrate after the second substrate is thinned from the fourth surface, with a location of the third opening corresponding to a location of the pressure sensing region.

16. The method for forming the MEMS pressure sensor according to claim 13, wherein the preparing the second substrate comprises: preparing a semiconductor-on-insulator substrate, wherein the semiconductor-on-insulator substrate comprises a base, an insulating layer on a surface of the base and a semiconductor layer on a surface of the insulating layer; and forming a piezoresistive element in the semiconductor layer, with the base being the second base.

17. The method for forming the MEMS pressure sensor according to claim 13, wherein the second substrate further comprises a second coupling layer arranged on the side of the third surface; or, the first substrate comprises a first coupling layer arranged on the side of the first surface; or, the second substrate further comprises a second coupling layer arranged on the side of the third surface and the first substrate comprise a first coupling layer arranged on the side of the first surface.

18. The method for forming the MEMS pressure sensor according to claim 17, wherein at least one of the first coupling layer and the second coupling layer is comprised of an insulating material.

19. The method for forming the MEMS pressure sensor according to claim 17, wherein the first surface of the first substrate and the third surface of the second substrate are bonded with each other by an adhesive bonding process, and the first coupling layer or the second coupling layer is an adhesive bonding layer which is comprised of an insulating material, a semiconductor material, a metal material or an organic material.

20. The method for forming the MEMS pressure sensor according to claim 13, wherein the first surface of the first substrate and the third surface of the second substrate are bonded with each other by a direct-bonding process.

21. The method for forming the MEMS pressure sensor according to claim 13, wherein the forming the cavity comprises: forming a first opening before the first surface of the first substrate and the third surface of the second substrate are bonded with each other, wherein the first opening is arranged on the side of the third surface of the second substrate or the side of the first surface of the first substrate, or, the first opening is arranged on both the side of the first surface of the first substrate and the side of the third surface of the second substrate, with a location of the first opening corresponding to a location of the pressure sensing region.

22. The method for forming the MEMS pressure sensor according to claim 13, wherein the first substrate further comprises a self-test electrode, with a location of the self-test electrode corresponding to a location of the pressure sensing region after the first surface of the first substrate and the third surface of the second substrate are bonded with each other.

23. The method for forming the MEMS pressure sensor according to claim 13, wherein the second substrate further comprises a reference unit region, a cavity is further formed between the first substrate and the reference unit region of the second substrate when the first surface of the first substrate and the third surface of the second substrate are bonded with each other, and a deformation on a portion of the second substrate corresponding to the reference unit region is less than a deformation on a portion of the second substrate corresponding to the pressure sensing region under a same external pressure.

24. The method for forming the MEMS pressure sensor according to claim 13, further comprising: forming a second opening passing through the first substrate, wherein a location of the second opening corresponds to a location of the pressure sensing region of the second substrate after the first surface of the first substrate and the third surface of the second substrate are bonded with each other.

25. The method for forming the MEMS pressure sensor according to claim 13, further comprising: forming at least one fifth through hole passing through the second base, on the side of the fifth surface of the second substrate, with a location of the fifth through hole corresponding to a location of the pressure sensing region.

26. The method for forming the MEMS pressure sensor according to claim 13, further comprising: forming a fourth conductive plug passing through the first substrate from the side of the second surface of the first substrate to the at least one conductive layer.

27. A Micro-Electro Mechanical System (MEMS) pressure sensor, comprising:
a first substrate, wherein the first substrate comprises a first surface and a second surface opposite to the first surface, and the first substrate comprises at least one conductive layer arranged on the side of the first surface of the first substrate;
a second substrate, wherein the second substrate comprises a third surface and a fifth surface opposite to the third surface, the second substrate comprises a piezoresistive element, and the second substrate comprises a pressure sensing region in which the piezoresistive element is arranged, the first surface of the first substrate and the third surface of the second substrate are bonded with each other;
a cavity formed between the first substrate and the pressure sensing region of the second substrate; and
a first conductive plug passing through the second substrate from the side of the fifth surface of the second substrate to the at least one conductive layer, wherein the first conductive plug is used to electrically connect the conductive layer to the piezoresistive element.

28. The MEMS pressure sensor according to claim 27, wherein the first substrate further comprises a circuit.

29. The MEMS pressure sensor according to claim 27, wherein the second substrate further comprises a second coupling layer arranged on the side of the third surface; or, the first substrate comprises a first coupling layer arranged on the side of the first surface; or, the second substrate further comprises a second coupling layer arranged on the side of the third surface and the first substrate comprises a first coupling layer arranged on the side of the first surface.

30. The MEMS pressure sensor according to claim 29, wherein at least one of the first coupling layer and the second coupling layer is comprised of an insulating material.

31. The MEMS pressure sensor according to claim 29, wherein the first coupling layer or the second coupling layer is an adhesive bonding layer which is comprised of an insulating material, a semiconductor material, a metal material or an organic material.

32. The MEMS pressure sensor according to claim 29, wherein the first coupling layer is a bonding layer; or, the second coupling layer is a bonding layer; or, the first coupling layer and the second coupling layer are bonding layers.

33. The MEMS pressure sensor according to claim 27, wherein the first substrate further comprises a self-test electrode, with a location of the self-test electrode corresponding to a location of the pressure sensing region of the second substrate.

34. The MEMS pressure sensor according to claim 27, wherein the second substrate further comprises a reference unit region, a cavity is further formed between the first substrate and the reference unit region of the second substrate, and a deformation on a portion of the second substrate corresponding to the reference unit region is less than a deformation on a portion of the second substrate corresponding to the pressure sensing region.

35. The MEMS pressure sensor according to claim 27, further comprising: a second opening passing through the first substrate, with a location of the second opening corresponding to a location of the pressure sensing region of the second substrate.

36. The MEMS pressure sensor according to claim 27, further comprising: a fourth conductive plug passing through the first substrate from the side of the second surface of the first substrate to the at least one conductive layer.

37. The MEMS pressure sensor according to claim 27, wherein
the second substrate comprises a second base and the piezoresistive element arranged on or above or in the second base.

38. The MEMS pressure sensor according to claim 37, wherein the first substrate further comprises a circuit.

39. The MEMS pressure sensor according to claim 37, wherein a third opening is formed in the second substrate, with a location of the third opening corresponding to a location of the pressure sensing region.

40. The MEMS pressure sensor according to claim 37, wherein the second substrate further comprises a second coupling layer arranged on the side of the third surface; or, the first substrate comprises a first coupling layer arranged on the side of the first surface; or, the second substrate further comprises a second coupling layer arranged on the side of the third surface and the first substrate comprises a first coupling layer arranged on the side of the first surface.

41. The MEMS pressure sensor according to claim 40, wherein at least one of the first coupling layer and the second coupling layer is comprised of an insulating material.

42. The MEMS pressure sensor according to claim 40, wherein the first coupling layer or the second coupling layer is an adhesive bonding layer which is comprised of an insulating material, a semiconductor material, a metal material or an organic material.

43. The MEMS pressure sensor according to claim 40, wherein the first coupling layer is a bonding layer; or, the second coupling layer is a bonding layer; or, the first coupling layer and the second coupling layer are bonding layers.

44. The MEMS pressure sensor according to claim 37, wherein the first substrate further comprises a self-test electrode, with a location of the self-test electrode corresponding to a location of the pressure sensing region of the second substrate.

45. The MEMS pressure sensor according to claim 37, wherein the second substrate further comprises a reference unit region, a cavity is further formed between the first substrate and the reference unit region of the second substrate, and a deformation on a portion of the second substrate corresponding to the reference unit region is less than a deformation on a portion of the second substrate corresponding to the pressure sensing region.

46. The MEMS pressure sensor according to claim 37, wherein a second opening passing through the first substrate is formed, with a location of the second opening corresponding to a location of the pressure sensing region of the second substrate.

47. The MEMS pressure sensor according to claim 37, further comprising: at least one fifth through hole arranged on the side of the fifth surface of the second substrate and passing through the second base, with a location of the fifth through hole corresponding to a location of the pressure sensing region.

48. The MEMS pressure sensor according to claim 37, further comprising: a fourth conductive plug passing through the first substrate from the side of the second surface of the first substrate to the at least one conductive layer.

* * * * *